United States Patent
Lai et al.

(10) Patent No.: US 11,416,666 B1
(45) Date of Patent: Aug. 16, 2022

(54) INTEGRATED CIRCUIT AND METHOD FOR FORMING THE SAME

(71) Applicant: TAIWAN SEMICONDUCTOR MANUFACTURING COMPANY, LTD., Hsinchu (TW)

(72) Inventors: Ming-Fang Lai, Hsinchu (TW); Guan-Yu Chen, Kaohsiung (TW); Yi-Feng Chang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/192,617

(22) Filed: Mar. 4, 2021

(51) Int. Cl.
- G06F 30/00 (2020.01)
- G06F 30/392 (2020.01)
- H01L 21/768 (2006.01)
- G06F 30/398 (2020.01)
- G06F 30/20 (2020.01)

(52) U.S. Cl.
CPC ............ G06F 30/392 (2020.01); G06F 30/20 (2020.01); G06F 30/398 (2020.01); H01L 21/768 (2013.01)

(58) Field of Classification Search
CPC ...... G06F 30/392; G06F 30/20; G06F 30/398; H01L 21/768
See application file for complete search history.

(56) References Cited

U.S. PATENT DOCUMENTS

| | | | | |
|---|---|---|---|---|
| 6,209,123 B1* | 3/2001 | Maziasz | .................. | G06F 30/39 716/135 |
| 6,792,582 B1* | 9/2004 | Cohn | ...................... | G06F 30/39 716/120 |
| 6,823,500 B1* | 11/2004 | Ganesh | ................. | G06F 30/392 716/135 |
| 7,111,266 B2* | 9/2006 | Correale, Jr. | ........... | G06F 30/30 716/120 |
| 7,200,825 B2* | 4/2007 | Watson | ................. | G06F 30/398 703/2 |
| 7,549,135 B2* | 6/2009 | Chapman | ............... | G06F 30/398 716/135 |
| 8,413,101 B2* | 4/2013 | Domanski | ............. | G06F 30/398 716/136 |
| 2014/0027810 A1* | 1/2014 | Yang | ................... | H01L 27/0921 716/110 |
| 2022/0037457 A1* | 2/2022 | Dos Santos Viegas | ..................... | H05K 1/165 |

FOREIGN PATENT DOCUMENTS

| CN | 100419990 C | * | 9/2008 | ......... G06F 17/5045 |
| WO | WO-2009144658 A1 | * | 12/2009 | ......... G06F 17/5072 |

* cited by examiner

Primary Examiner — Naum Levin
(74) Attorney, Agent, or Firm — Birch, Stewart, Kolasch & Birch, LLP

(57) ABSTRACT

A method for forming an integrated circuit (IC) is provided. The method includes obtaining an IC design; generating a layout according to the IC design; calculating a score of a region in the layout based on voltage levels in the region; and fabricating a semiconductor device according to the layout when the score of the region in the layout is equal to or less than a threshold value.

20 Claims, 28 Drawing Sheets

INTEGRATED CIRCUIT AND METHOD FOR FORMING THE SAME

BACKGROUND

The semiconductor integrated circuit (IC) industry has experienced rapid growth. Continuing advances in semiconductor manufacturing processes have resulted in semiconductor device structures with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

The recent trend in miniaturizing IC has resulted in smaller devices which consume less power yet provide more functionality at higher speeds. However, the miniaturization process has also resulted in stricter design and manufacturing specifications as well as reliability challenges. For one or more of these advantages to be realized, various developments in IC design and/or manufacture are considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
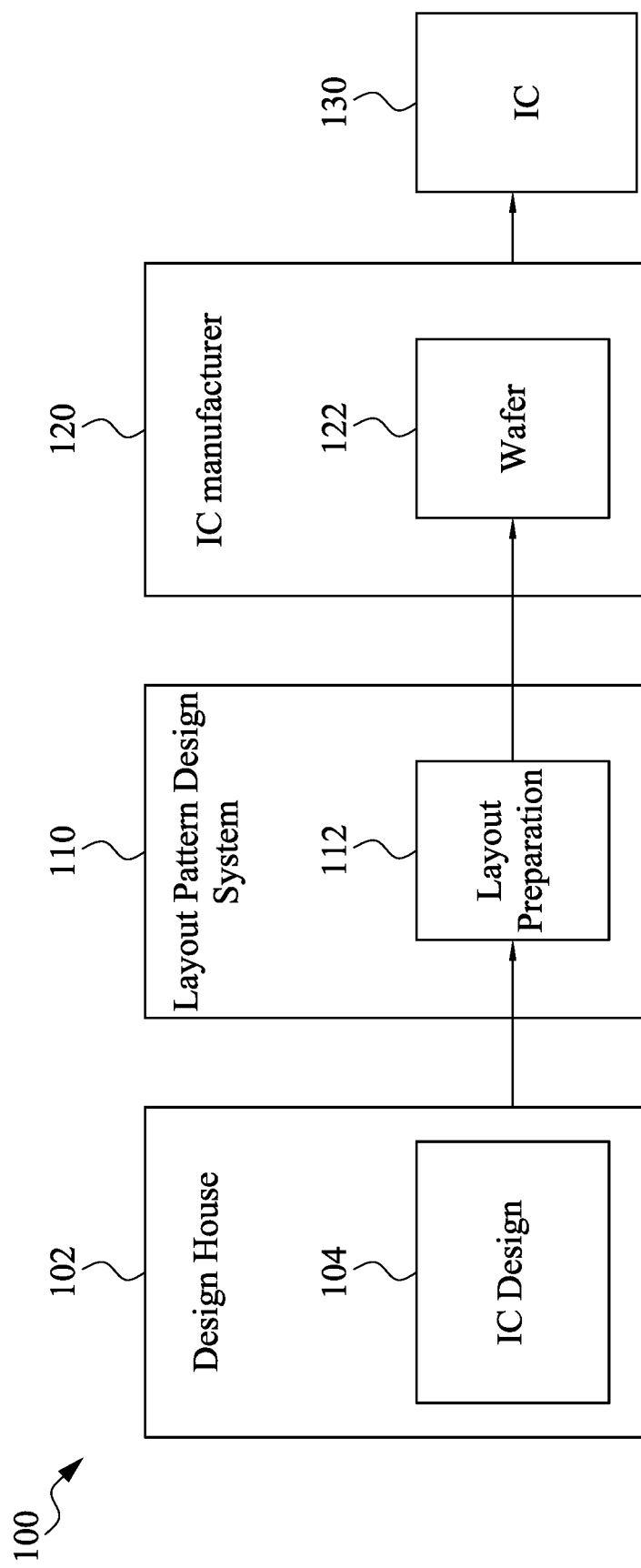
FIG. 1A is a simplified block diagram of an integrated circuit (IC) manufacturing system and an associated IC manufacturing flow according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuits (ICs) become smaller in physical size, and the quantity of transistors included in the device increases, smaller line widths are used in the ICs, and the transistors therein are located closer together. Latch-up is a type of short circuit that sometimes occurs in ICs. To prevent latch-up, some ICs include tap cells, which may couple well regions and substrate regions to suitable supply voltages. Through the usage of tap cells, the substrate resistance and undesirable positive feedback in the IC is reduced, thereby avoiding the latch-up. However, the tap cells may increase the overall size of the IC.

In some embodiments of the present disclosure, a layout of the ICs is generated by placing the tap cells, the transistors, and/or interconnect metallization pattern in an arrangement that is less likely to induce latch-up. In furtherance, a step for calculating scores of plural regions of the layout is performed, and high risk regions are found out according to the scores of these regions. When generating the IC layout, the high risk regions are placed with more tap cells, or operating voltage of devices (e.g., transistors) in the high risk regions are changed, thereby avoiding the latch-up.

Semiconductor fabrication of ICs includes, for example, front-end-of-line (FEOL), middle-end-of-line (MEOL) process, and back-end-of-line (BEOL) processes. FEOL encompasses processes related to fabricating IC devices, such as transistors. For example, FEOL process can include forming isolation features, gate structures, and source/drain features. MEOL process can include processes related to fabricating contacts to conductive features (or conductive regions) of the IC devices, such as contacts to the gate structures and/or the source/drain features. BEOL process includes processes related to fabricating a multilayer interconnect (MLI) feature that interconnects IC features fabricated by FEOL and MEOL process. Layouts of semiconductor structures in following embodiments associated with, and/or formed in, various processes are within the contemplated scope of the present disclosure.

FIG. 1A is a simplified block diagram of an IC manufacturing system 100 and an associated IC manufacturing flow according to some embodiments of the present disclosure. The IC manufacturing system 100 includes plural entities, such as a design house 102, an layout pattern design system 110, and an IC manufacturer 120 (i.e., a fab), that interact with one another in the design, development, and manufacturing cycles and/or services related to manufacturing an integrated circuit (IC) 130. The IC 130 may include plural semiconductor devices.

The entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 102, layout pattern design system 110, and IC manufacturer 120 may be owned by a single larger company, and may even coexist in a common facility and use common resources.

The design house (or design team) 102 generates an IC design 104. In some embodiments, the IC design 104 includes processing data which are used in layout pattern, mask design and semiconductor processes for manufacturing the IC 130. The IC design 104 may further include various geometrical patterns designed for the IC 130. The geometrical patterns correspond to patterns of metal, oxide, or semiconductor layers that make up the various components of the IC 130 to be fabricated. The various layers combine to form various IC features.

For example, a portion of the IC design 104 includes various IC features, such as active regions, gate electrodes, sources and drains, metal lines or vias of an interlayer interconnection, and openings for bonding pads, to be formed in a semiconductor substrate (such as a silicon wafer) and various material layers disposed on the semiconductor substrate. The design house 102 may implement suitable design procedure to form the IC design 104. The design procedure may include logic design, physical design, and/or place and route.

The layout pattern design system 110 includes a layout preparation 112, and the layout preparation 112 receives the IC design 104 from the design house 102 to generate layout pattern for manufacturing the semiconductor devices on the wafer 122. Therefore, the semiconductor process is performed on the wafer 122 in the FAB 120 according to the layout patterns which were determined by the layout pattern design system 110.

The IC manufacturer 120, such as a semiconductor foundry, uses the processing parameters generated by the layout pattern design system 110 to fabricate the IC 130. The IC manufacturer 120 is an IC fabrication business that can include a myriad of manufacturing facilities for the fabrication of a variety of different IC products. For example, there may be a first manufacturing facility for the front end fabrication of IC products (i.e., FEOL fabrication), while a second manufacturing facility may provide the back end fabrication for the interconnection and packaging of the IC products (i.e., BEOL fabrication), and a third manufacturing facility may provide other services for the foundry business.

In the present embodiment, a wafer 122 is fabricated using one or more masks to form the IC 130. The semiconductor wafer includes a silicon substrate or another proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer 122 may further include various doped regions, dielectric features, and multilevel interis connected to (formed at subsequent manufacturing steps).

Figure 1B:
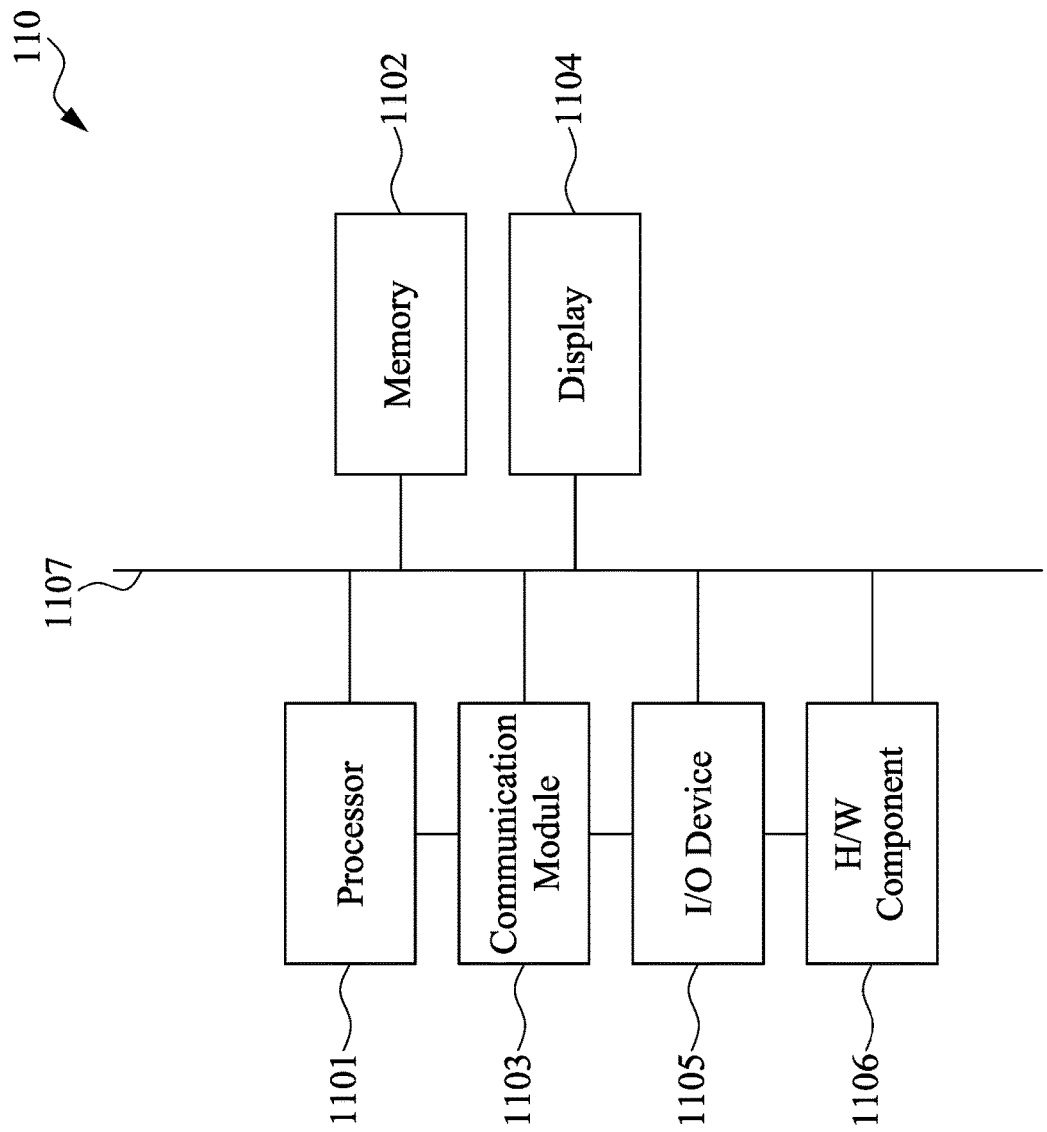
FIG. 1B is a more detailed block diagram of the layout pattern design system shown in FIG. 1A according to some embodiments of the present disclosure.

FIG. 1B is a more detailed block diagram of the layout pattern design system 110 shown in FIG. 1A according to some embodiments of the present disclosure. One or more of the tools and systems and operations described with respect to FIGS. 3A-8 is realized in some embodiments by the layout pattern design system 110 of FIG. 1B. The layout pattern design system 110 includes a processor 1101, a memory 1102, a communication module 1103, a display 1104, an input/output (I/O) device 1105, and one or more hardware components 1106 communicatively coupled via a bus 1107 or another interconnection communication mechanism.

The processor 1101 could include a digital signal processor (DSP), a microcontroller (MCU), a central-processing unit (CPU) or a plurality of parallel processors relating the parallel processing environment to implement the operating system (OS), firmware, driver and/or other applications of the layout pattern design system 110.

The memory 1102 comprises, in some embodiments, a random access memory (RAM) or another dynamic storage device or read only memory (ROM) or other static storage devices, coupled to the bus 1107 for storing data and/or instructions to be executed by the processor 1101. The memory 1102 is also used, in some embodiments, for storing temporary variables or other intermediate information during the execution of instructions to be executed by the processor 1101.

The communication module 1103 is operable to communicate information such as IC design layout files with the other components in the IC manufacturing system 100, such as design house 102. Examples of communication modules may include Ethernet cards, WiFi devices, cellular data radios, and/or other suitable devices.

The display 1104 is utilized to display the processing data and processing parameter the IC 130. The display 1104 can be a liquid-crystal panel or a touch display panel. The I/O device 1105 includes an input device, an output device and/or a combined input/output device for enabling user interaction with the layout pattern design system 110. An input device comprises, for example, a keyboard, keypad, mouse, trackball, trackpad, and/or cursor direction keys for communicating information and commands to the processor 1101. An output device comprises, for example, the display (e.g., the display 1104), a printer, a voice synthesizer, etc. for communicating information to the user.

Figure 2:
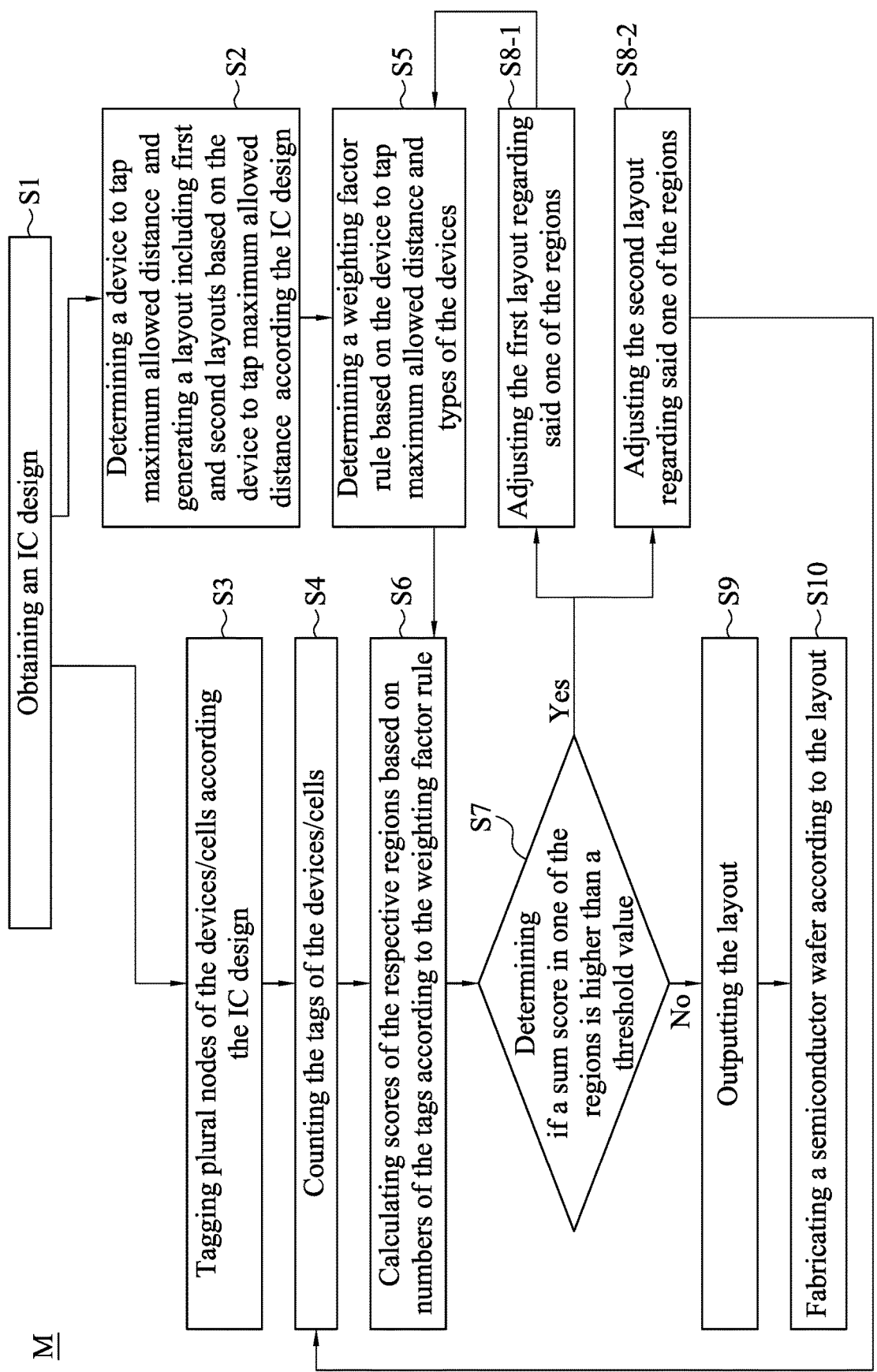
FIG. 2 is a flowchart of a method of generating a layout of an integrated circuit according to some embodiments of the present disclosure.

FIG. 2 is a flowchart of a method M of generating a layout of an IC according to some embodiments of the present disclosure. The method M may include plural operations S1-S10. The illustration is merely exemplary and is not intended to be limiting beyond what is specifically recited in the claims that follow. It is understood that additional operations may be provided before, during, and after the operations S1-S10, and some of the operations S1-S10 described below can be replaced or eliminated for additional embodiments of the method. The order of the operations may be interchangeable.

Figure 3A:
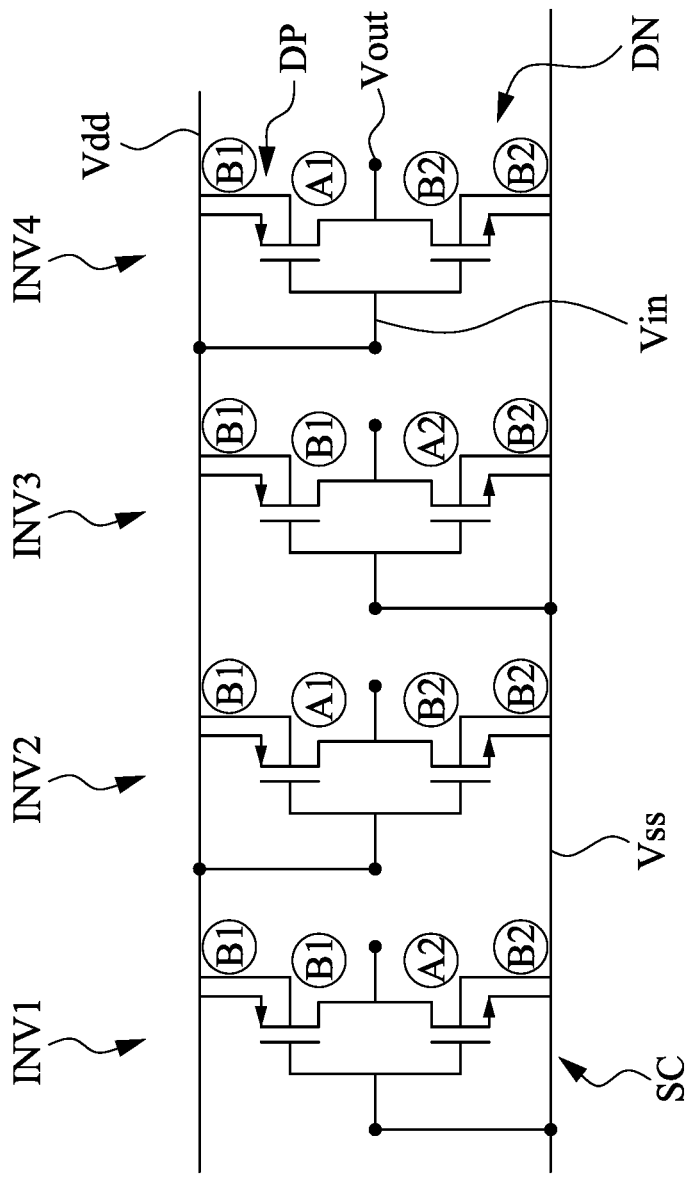
FIG. 3A illustrates a portion of an IC design according to some embodiments of the present disclosure.
Figure 3B:
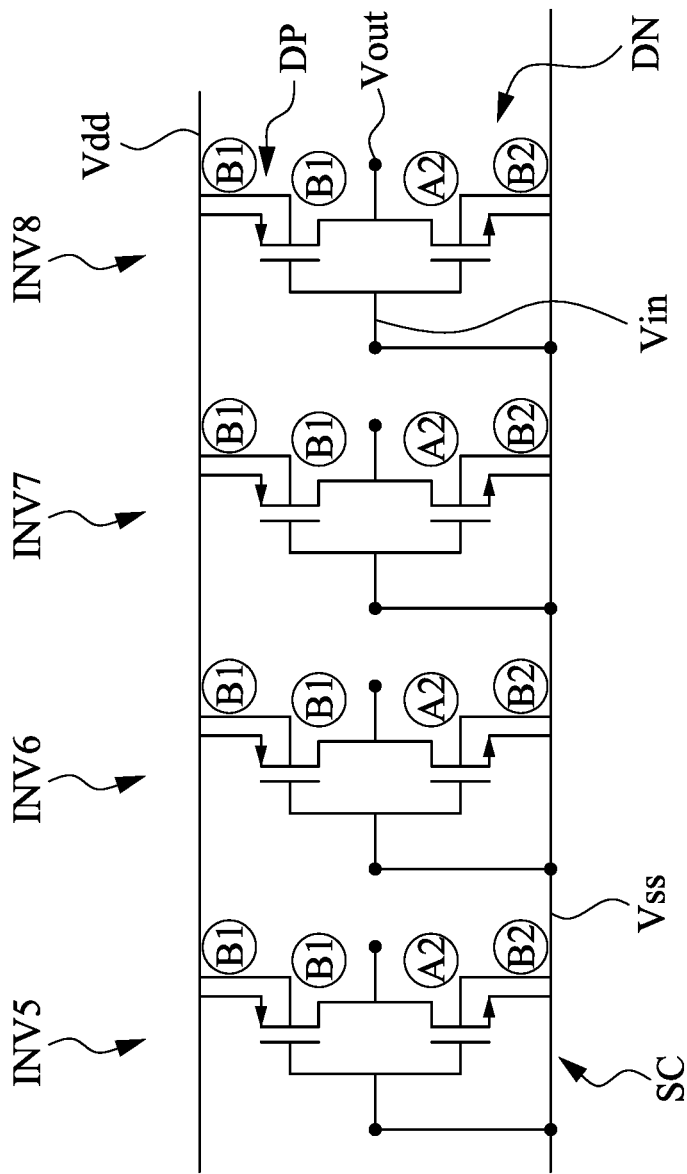
FIG. 3B illustrates another portion of the IC design according to some embodiments of the present disclosure.

In operation S1 of method M, referring to FIGS. 2, 3A, and 3B, an IC design 104 may be obtained, for example, from the design house 102, the layout pattern design system 110, or the IC manufacturer 120 (referring to FIG. 1A). In the present embodiments, the IC design 104 includes plural standard cells SC formed of n-type devices DN and p-type devices DP. The standard cells SC may be inverters INV1-INV8. For example, an inverter includes a device DP and a device DN, in which a source of the device DP is directedly connected to a high power rail Vdd, a source of the device DN is directedly connected to a low power rail Vss, a drain of the device DP is connected to a drain of the device DN, and a gate of the device DP is connected to a gate of the device DN. The standard cells SC may be designed to operate at suitable high/low input voltages. For example, the present embodiments, the inverters INV1, INV3, and INV5-INV8 have a low input voltage. For example, the gates of the devices DN and DP of the inverters INV1, INV3, and INV5-INV8 are connected to the low power rail Vss. In the present embodiments, the inverters INV2 and INV4 have a high input voltage. For example, the gates of the devices DN and DP of the inverters INV2 and INV4 are connected to the high power rail Vdd.

In some other embodiments, the standard cells SC may be other logic gate cells, such as AND, OR, NAND, NOR, XOR, AND-OR-Invert (AOI), OR-AND-Invert (OAI), MUX, Flip-flop, BUFF, Latch, delay, clock cells or the like. In some other embodiments, the standard cell SC may be a memory cell. In some other embodiments, a memory cell includes a static random access memory (SRAM), a dynamic RAM (DRAM), a resistive RAM (RRAM), a magnetoresistive RAM (MRAM), read only memory (ROM), or the like. In some other embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors, or the like.

In the context, a voltage potential of the high power rail Vdd is higher than a voltage potential of the low power rail Vss. For example, in some embodiments, the high power rail Vdd is electrically coupled to a power source providing a positive voltage potential, and the low power rail Vss corresponds to the electrical ground.

Figure 4A:
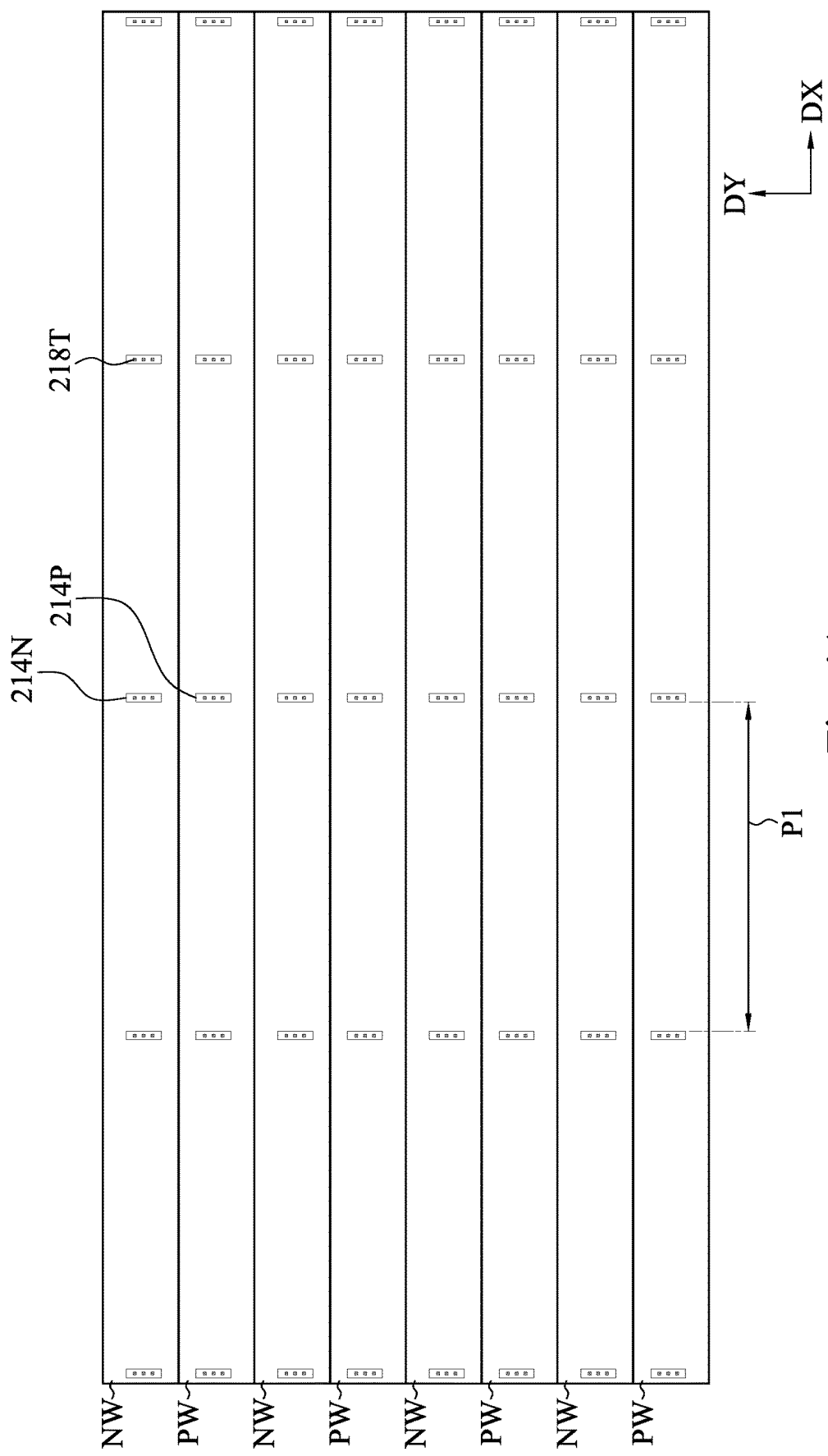
FIG. 4A illustrates arranging plural tap regions in a first layout of an integrated circuit according to some embodiments of the present disclosure.
Figure 4B:
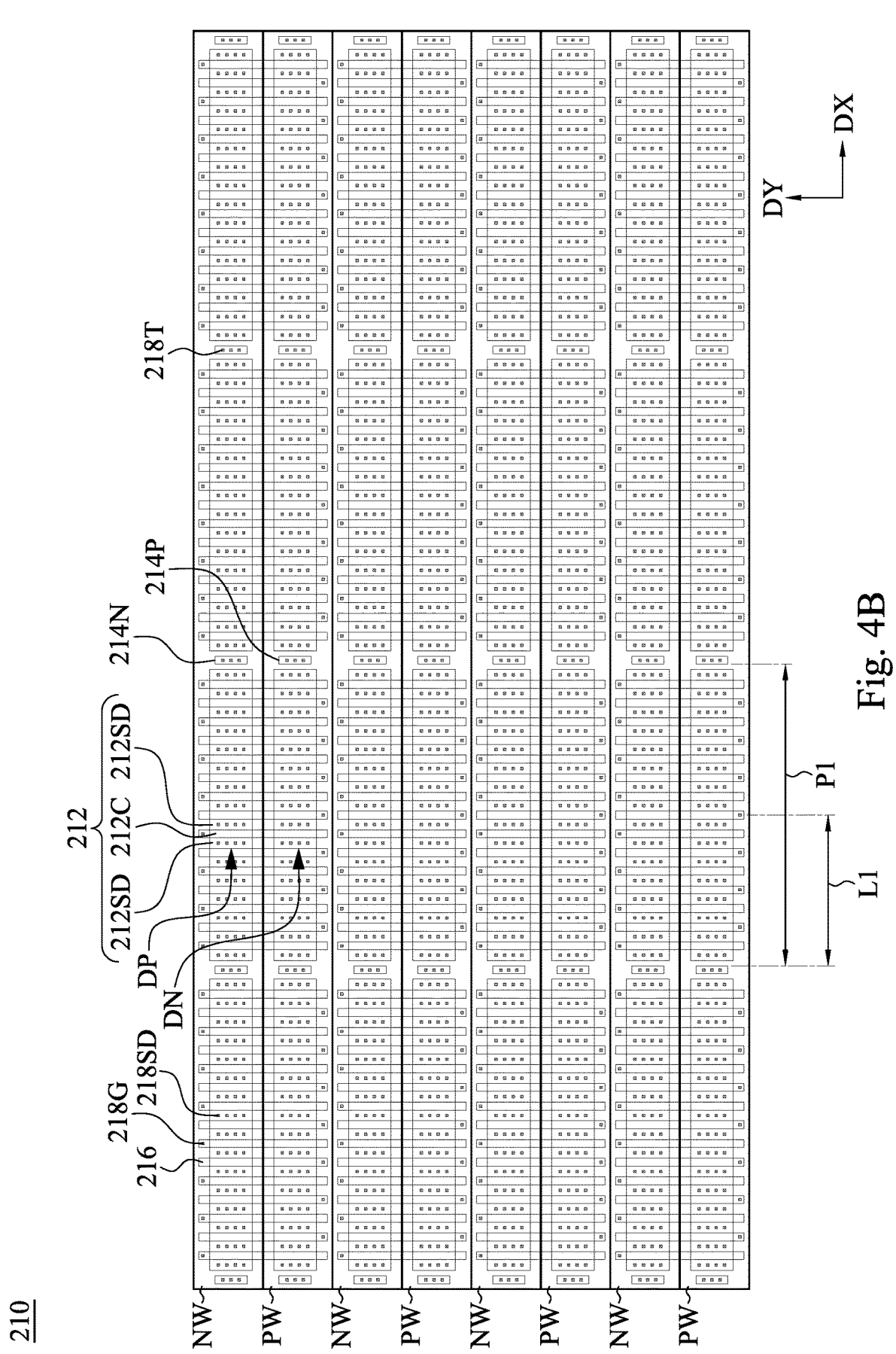
FIG. 4B illustrates arranging plural devices in the first layout of the integrated circuit of FIG. 4A according to some embodiments of the present disclosure.

In operation S2 of method M, referring to FIGS. 2, 4A, 4B, and 5A, after obtaining the IC design 104, a layout 200 including a first layout 210 and a second layout over the first layout 210 is generated according to the IC design 104. In some embodiments, a floorplanning method (e.g., static state driven floorplanning method) is performed for generating the first layout 210 as shown in FIGS. 4A and 4B, and then a physical design method (e.g., Automatic Placement & Routing (APR) method) is perform for generating the second layout, which is simplified and shown in FIG. 5A. In some embodiments of the present disclosure, the first layout 210 may include a FEOL layout and a MEOL layout, and the second layout may include a BEOL layout.

FIG. 4A illustrates arranging plural tap regions 214N/214P in a first layout 210 of an integrated circuit according to some embodiments of the present disclosure. For example, the n-type well regions NW, p-type well regions PW, and tap regions 214N and 214P are arranged in the first layout 210.

In some embodiments, the p-type well regions PW may be portions of substrate that are lightly doped with a p-type impurity, such as boron, gallium, and indium. The substrate may include suitable semiconductor material, such as silicon, silicon germanium, or other suitable semiconductor materials. For example, a concentration of the p-type impurities in the p-type well regions PW may be less than $10^{13}/cm^3$. In some embodiments, the n-type well regions NW are formed in the substrate by implantation (or diffusion) of n-type impurities such as antimony, phosphorus and arsenic. For example, a concentration of the n-type impurities in the n-type well regions NW may be less than $10^{13}/cm^3$. In some other embodiments, well regions PW and NW may also be formed by epitaxially growing n-type layers on the p-type substrate, then implant (or diffuse) p-type impurities into regions of n-type layers so these regions of n-type layers are converted to p-type, and remaining regions become n-wells.

In some embodiments; the tap region 214N includes a n-type heavily doped region in the n-type well region NW. For example, a concentration of the n-type impurities in the tap region 214N may be greater than $10^{19}/cm^3$. The n-type heavily doped region (i.e., the tap region 214N) is coupled through suitable conductive elements to a high power rail Vdd which corresponds to the power source, and thus sets the potential of the n-type well region NW to prevent leakage from adjacent source/drain regions into the well region NW. The tap region 214P may have a conductive type different from that of the tap region 214N. In some embodiments of the present disclosure, the tap region 214P includes a p-type heavily doped region in the p-type well region PW. For example, a concentration of the p-type impurities in the tap region 214P may be greater than $10^{19}/cm^3$. The p-type heavily doped region (i.e., the tap region 214P) is coupled through the suitable conductive elements to a low power rail Vss which corresponds to the electrical ground, and thus sets the potential of the p-type well region PW (e.g., the p-type substrate) to prevent leakage from adjacent source/drain regions.

In some embodiments, the tap regions 214N and 214P are arranged in columns and rows. In some embodiments, adjacent two tap regions 214N are spaced apart by a pitch P1 in a direction DX, such that the active regions 212 (referring to FIG. 4C) may be located between adjacent two tap regions 214N in the direction DX. Similarly, in some embodiments, adjacent two tap regions 214P are spaced apart by a pitch P1 in a direction DX, such that the active regions 212 (referring to FIG. 4C) may be located between adjacent two tap regions 214P in the direction DX. In some embodiments, the tap region 214N and the tap region 214P may be aligned with each other in a direction DY perpendicular to the direction DX, and located appropriate distances from one another to prevent latch-up.

In some embodiments, the pitch P1 between two adjacent tap regions 214N/214P may be designed according a spacing design rule. For example, the tap regions 214N and the tap regions 214P are positioned so that the distance from any point in either the well regions NW/PW to the nearest tap regions 214N/214P should not be greater than a device to tap maximum allowed distance. In some embodiments, the pitch P1 may be equal to or less than twice the device to tap maximum allowed distance in some embodiments.

The maximum allowed distance may be determined based on a predetermined set of spacing design rules associated with the integrated circuit 104 (referring to FIGS. 3A-3B) prior to generating the layout 210. For example, one of the spacing design rules may include experimentally verifying a holding voltage and a trigger voltage of the integrated circuit prior to generating the layout 210, thereby determining the maximum allowed distance according to the result. Furthermore, some of the design rules specify various other physical parameters for the proper construction of the interconnect structure such as a minimum allowable distance between wires or conducting paths and a minimum allowable width of such wires. The maximum allowed distance may be in a range from about 10 micrometers to about 1000 micrometers depending on gate density, well height, application bias, operation temperature, process condition, and so on. If the maximum allowed distance is less than dozens of micrometers, the tap regions 214P/214N may unnecessarily occupy too much chip area, and thereby reducing yield rate. If the maximum allowed distance is greater than about hundreds of micrometers, latch-up issue may become dominant.

FIG. 4B illustrates arranging plural devices in the first layout 210 of the integrated circuit of FIG. 4A according to some embodiments of the present disclosure. For example, the active regions 212 and gate structures 216 are added into the first layout 210 between two adjacent tap regions 214N/214P. Through the step, the first layout 210 includes one or more layouts of active regions, gate electrodes, the tap regions, and other elements of the devices in the FEOL process. For example, the first layout 210 includes n-type well regions NW, p-type well regions PW, active regions 212, tap regions 214N and 214P, and gate structures 216.

In some embodiments, isolation features (e.g., silicon oxide or other suitable dielectric material) may be formed in the well regions PW and NW, thereby defining the active regions 212 in the well regions NW and PW. In some embodiments, the active regions 212 include channel regions 212C and source/drain regions 212SD in the well regions PW and NW. The gate structures 216 overlie the channel regions 212C of the active regions 212. In some embodiments, the source/drain regions 212SD are n-type heavily doped regions in the p-type well region PW. For example, a concentration of the n-type impurities in the source/drain regions 212SD may be greater than $10^{19}/cm^3$. The n-type impurities may include antimony, phosphorus and arsenic. In some embodiments, the source/drain regions 212SD are p-type heavily doped regions in the n-type well region NW. For example, a concentration of the p-type impurities in the source/drain regions 212SD may be greater than $10^{19}/cm^3$. The p-type impurities may include boron, gallium, and indium. In some embodiments, the channel regions 212C may be doped less the source/drain regions 212SD. For example, a concentration of the impurities in the channel regions 212C may be less than $10^{13}/cm^3$.

The configuration of the active regions 212 and the gate structures 216 forms plural devices DN and DP in the well regions PW and NW, respectively. The devices DN may have a conductive type different from that of the devices DP. For example, in some embodiments, each of the devices DN includes a channel region 212C, the n-type source/drain regions 212SD on opposites of the channel region 212C, and a gate structure 216 overlying the channel region 212C. In some embodiments, each of the devices PN includes a channel region 212C, the p-type source/drain regions 212SD on opposites of the channel region 212C, and a gate structure 216 overlying the channel region 212C. In some embodiments, the n-type devices DN and the p-type devices DP may be a N-type metal-oxide-semiconductor (NMOS) transistor and a P-type metal-oxide-semiconductor (PMOS). In the context, the n-type devices DN and the p-type devices DP in the layout 210 may correspond to the p n-type devices DN and the p-type devices DP in the IC design 104 (referring to FIGS. 3A and 3B).

In some embodiments, the first layout 210 may further include a layout of contacts in the MEOL process. For example, the first layout 210 includes the source/drain contacts 218SD, gate contacts 218G, and tap contacts 218T respectively connected to the source/drain regions 212SD, the gate structures 216, and the tap regions 214N/214P.

Figure 4C:
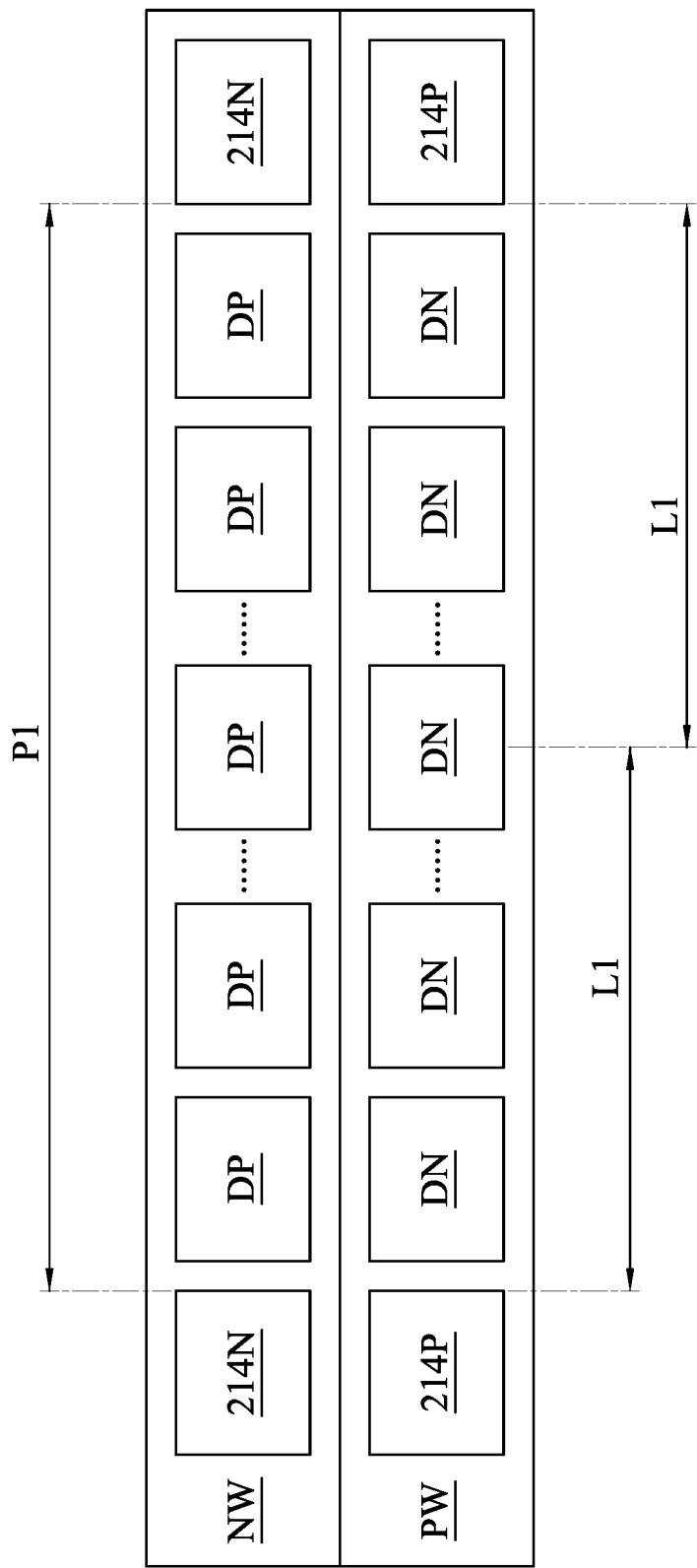
FIG. 4C schematically illustrates an enlarged portion of FIG. 4B.

FIG. 4C schematically illustrates an enlarged portion of FIG. 4B. Reference is made to FIGS. 4B and 4C. In some embodiments of the present embodiments, the first layout 210 of the layout 200 is generated by the floorplanning method, which arranges plural devices DN/DP and plural tap regions 214P/214N based on the maximum allowed distance, thereby ensuring latch-up immunity. For example, the floorplanning method for generating the first layout 210 is performed such that a distance between any one of the devices DP/DN and the nearest tap regions 214N/214P is not greater than the maximum allowed distance. For example, a largest distance LI between one of the devices DN/DP and the nearest tap regions 214N/214P is designed to be equal to or less than the maximum allowed distance. After generating the first layout 210 by the floorplanning method, the physical design method is performed for generating a BEOL layout as shown in following FIGS. 5A-5C.

Figure 5A:
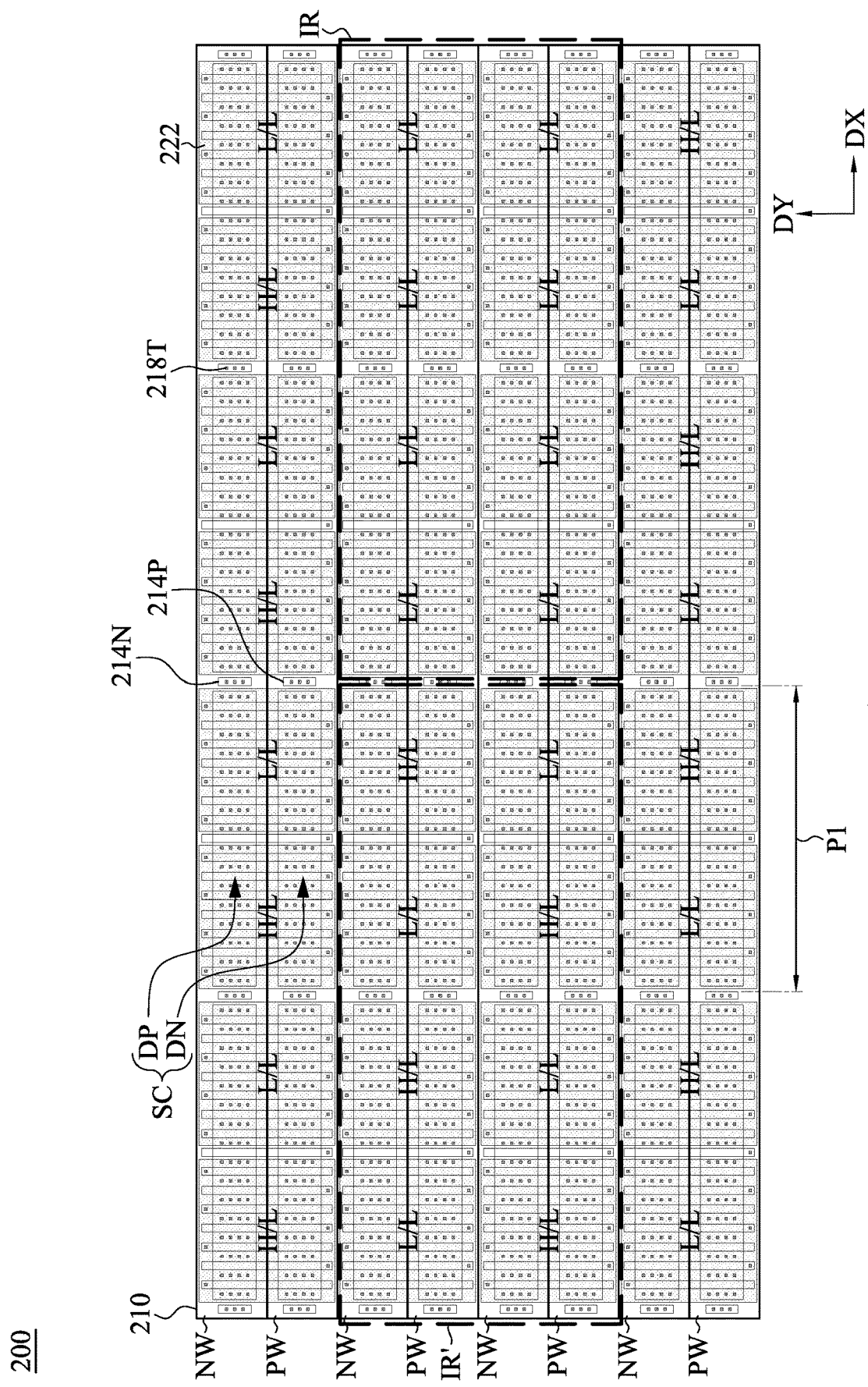
FIG. 5A shows a layout including the first layout of FIG. 4B and BEOL blocks of the integrated circuit according to some embodiments of the present disclosure.

FIG. 5A shows the first layout 210 of FIG. 4A and the second layout (e.g., the BEOL layout) overlying the first layout 210 according to some embodiments of the present disclosure. For simplifying the figures, the BEOL layout is briefly illustrated as BEOL blocks 222 in FIG. 5A. The BEOL blocks 222 includes interconnection among the devices DN/DP, the tap regions 214P/214N, and other elements. Through the interconnection of the BEOL blocks 222, the devices DN/DP forms the standard cells SC. In some embodiments, the BEOL layout may include suitable taps that respectively couple the tap regions 214N/214P to suitable supply voltages through the tap contacts 218T, thereby forming plural tap cells. In the present context, a cell refers to a group of one or more circuit elements such as transistors, capacitors, resistors, inductors, and other basic circuit elements combined to perform certain functions.

In some embodiments, in FIG. 5A, according to the input voltages, the BEOL blocks 222 are annotated with H/L and L/L. To be specifically, in the H/L blocks, a portion of the standard cells SC may have a high input voltage, and the other portion of the standard cells SC may have a low input voltage. In some embodiments, in the L/L block, all the standard cells SC may have a low input voltage.

In some embodiments, the input voltage Vin of the standard cells SC in each block 222 may change over time according to the design. That is, at least one of the standard cells SC in each block 222 may have a high input voltage at a first time range, and have a low input voltage at a second time range different from the first time range. For example, FIG. 5A shows an operating situation at a first time range, the H/L blocks 222 in FIG. 5A may change to be L/L blocks at a second time range different from the first time range, or/and the L/L blocks 222 in FIG. 5A may change to be H/L blocks at a third time point different from the first time range.

Figure 5B:
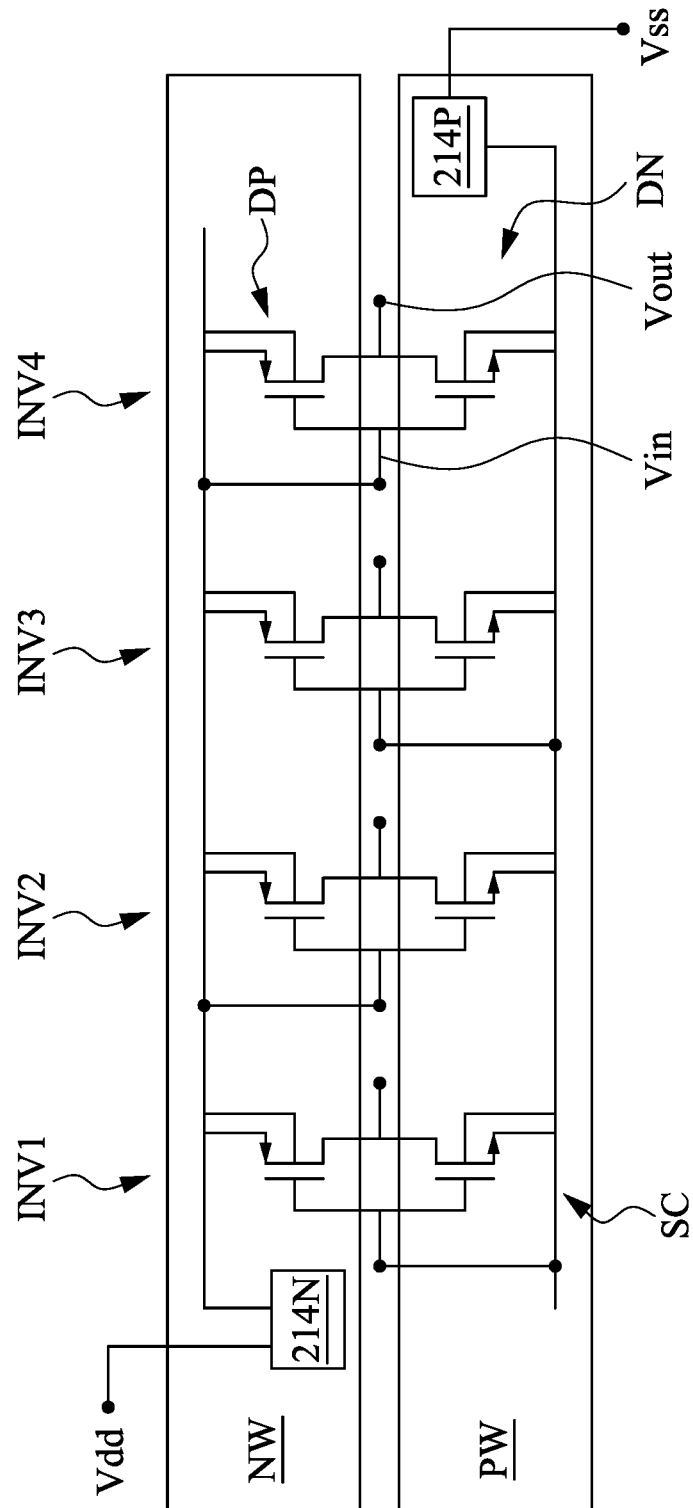
FIG. 5B illustrates a circuit diagram corresponding to a portion of a H/L block of FIG. 5A.
Figure 5C:
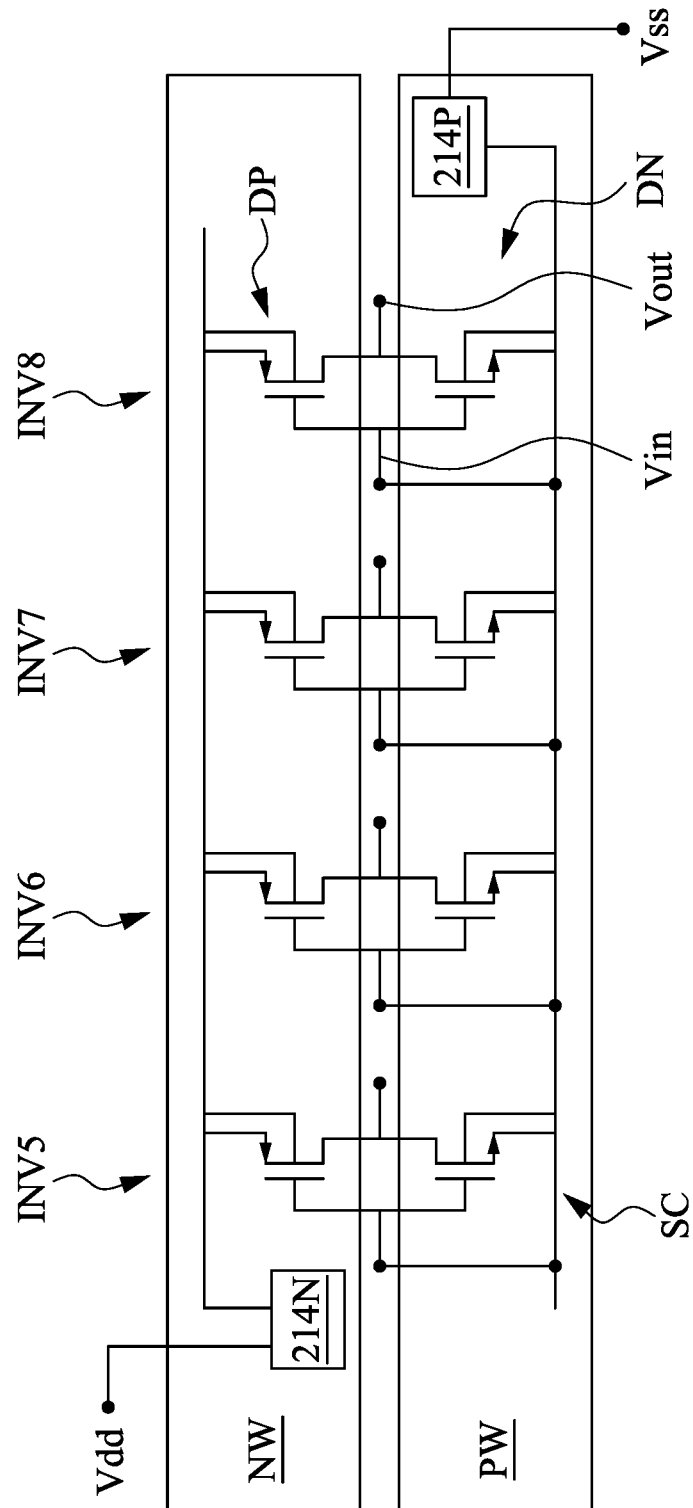
FIG. 5C illustrates a circuit diagram corresponding to a portion of a L/L block of FIG. 5A.

FIG. 5B illustrates a circuit diagram corresponding to a portion of the H/L block of FIG. 5A. FIG. 5C illustrates a circuit diagram corresponding to a portion of L/L block of FIG. 5A. Reference is made to FIGS. 5A-5C. In the present embodiments, the devices DN/DP in the first layout 210 and the interconnection of the BEOL layout (e.g., the BEOL blocks 222 in FIG. 5A) are arranged according to the IC designed 104 (referring to FIGS. 3A and 3B), thereby forming the inverters INV1-INV8. The input terminals Vin of the inverters INV1-INV8 may be respectively connected to suitable power source according to the IC design 104, such that the inverters INV1-INV8 have suitable high/low input voltages. Referring to the FIGS. 5A and 5B, in the H/L blocks, a portion of the standard cells SC (e.g., the inverters INV2 and INV4) have a high input voltage, and the other portion of the standard cells SC (e.g., the inverters INV1 and INV3) have a low input voltage. Referring to the FIGS. 5A and 5C, in the L/L blocks, all the standard cells SC (e.g., the inverters INV5-INV8) have a low input voltage. In the context, the standard cells SC and the inverters INV1-INV8 in the layout 200 may correspond to the standard cells SC and the inverters INV1-INV8 in the IC design 104 (referring to FIGS. 3A and 3B).

In some cases, according to the IC design 104 (referring to FIGS. 3A and 3B), the p-type device DP may include drain at low voltage level, which may induce leakage current to n-type tap region 214N through the n-type well NW. Also, the n-type device DN may include drain at high voltage level, which may induce leakage current to p-type tap region 214P through the p-type well PW. If the low-voltage drain of the p-type device DP and the high-voltage drain of the n-type device DN are densely located in a region that is far from the tap region 214N/214P, parasitic silicon controlled rectifier (SCR) may be triggered, which may lead to latch-up issue. In other words, the larger leakage current and the larger space from the device DN/DP to the tap region 214P/214N, the easier to trigger the parasitic SCR and leads to latch up issues. Furthermore, in some embodiments, the layout 210 may also include other devices (e.g., passive devices) having n-type doped region in the p-type well region PW or/and p-type doped region in the n-type well region NW. When the p-type doped region is at low voltage level, leakage current to n-type tap region 214N through the n-type well NW may be induced. When the n-type doped region is at high voltage level, leakage current to the p-type tap region 214P through the p-type well PW may be induced.

In some further cases, according to the IC design 104 (referring to FIGS. 3A and 3B), the p-type device DP may include drain/source at a high voltage level, and n-type device DN may include drain/source at a low voltage level. The configuration may create the parasitic SCR, in which the drain/source of the p-type device DP acts as the SCR anodes, and the drain/source of the n-type device DN acts as the SCR cathodes. If SCR anodes and SCR cathodes are densely located in a region far from bulk tap region 214N/214P, latch-up issue may become serious. Furthermore, in some embodiments, the layout 210 may also include other devices (e.g., passive devices) having n-type doped region in the p-type well region PW or/and p-type doped region in the p-type well region NW. When the n-type doped region is at low voltage level and/or the p-type doped region is at high voltage level, the configuration may create the parasitic SCR, in which the p-type doped region acts as the SCR anodes, and the n-type doped region acts as the SCR cathodes.

Reference is made back to FIGS. 2 and 3A-3B. In operations S3 of method M, plural nodes of the devices DN/DP and other devices (e.g., passive devices) are tagged according the IC design 104. For example, as shown in FIG. 3A, for evaluating the latch-up issue induced by leakage current, the drains of the p-type devices DP at low voltage level are tagged as "A1," and the drains of the n-type devices DN at high voltage level are tagged as "A2." In some embodiments, for evaluating the latch-up issue induced by SCR anode and cathode, the drain/sources of the p-type devices DP at a high voltage level are tagged as "B1," and the drain/sources of the n-type devices NP at a low voltage level are tagged as "B2." That is, the SCR anodes may be tagged as "B1," and the SCR cathodes may be tagged as "B2." In some embodiments, a tag is the identity of nodes of a device that can be used for grouping, describing, or finding nodes of devices. Tags assigned to nodes of devices can be used for creating selections, for finding nodes of devices, and for distributing nodes of devices among administration groups. The node of the devices can be tagged manually or automatically (e.g., by the processor 1101 in FIG. 1B). In the present embodiments, four types of the tags are used for identifying the nodes of the devices. In some other embodiments, more than four types of the tags may be used for identifying the nodes of the devices.

In some other embodiments, nodes of other devices (e.g., passive devices) may also be tagged. For example, if the other devices (e.g., passive devices) having a p-type doped region in the n-type well region NW (referring to FIGS. 4B-5B) at low voltage level, the p-type doped region at low voltage level is tagged as "A1." For example, if the other devices (e.g., passive devices) having a n-type doped region in the p-type well region PW (referring to FIGS. 4B-5B) at high voltage level, the n-type doped region at high voltage level is tagged as "A2." For example, if the other devices (e.g., passive devices) having a p-type doped region in the n-type well region NW (referring to FIGS. 4B-5B) at high voltage level, the p-type doped region at high voltage level is tagged as "B1." For example, if the other devices (e.g., passive devices) having a n-type doped region in the p-type well region PW (referring to FIGS. 4B-5B) at low voltage level, the n-type doped region at low voltage level is tagged as "B2."

Reference is made to FIG. 2 and FIGS. 3A-3B. In operations S4 of method M, the tags A1, A2, B1, and B2 are respectively counted, thereby evaluating the leakage current and the parasitic SCR, which may result in the latch-up issue. For example, by the tagging, a number of the drains of the p-type devices DP at low voltage level (i.e., the number of the tags A1) can be counted and obtained, and a number of the drains of the n-type devices DN at high voltage level (i.e., the number of the tags A2) can be counted and obtained. By the tagging, a number of the drain/sources of the p-type devices DP at a high voltage level (i.e., a number of the tags B1) can be counted and obtained, and a number of drain/sources of the n-type devices NP at a low voltage level (i.e., a number of the tags B2) can be counted and obtained.

In the present embodiments, a p-type device DP of the inverter INV1 has a source and a drain directly/indirectly connected to the high voltage rail Vdd, thereby being at high voltage level, such that the numbers of the tags A1, A2, B1, and B2 of the p-type device DP of the inverter INV1 are respectively 0, 0, 2, 0. An n-type device DN of the inverter INV1 has a drain at high voltage level and a source at low voltage level, such that the numbers of the tags A1, A2, B1, and B2 of the p-type device DP of the inverter INV1 are respectively 0, 1, 0, 1. Therefore, the numbers of the tags A1, A2, B1, and B2 of the inverter INV1 are respectively 0, 1, 2, 1.

On the other hand, a p-type device DP of the inverter INV2 has a source at high voltage level and a drain at low voltage level, such that the numbers of the tags A1, A2, B1, and B2 of the p-type device DP of the inverter INV2 are respectively 1, 0, 1, 0. An n-type device DN of the inverter INV2 has a drain and a source at low voltage level, such that the numbers of the tags A1, A2, B1, and B2 of the a n-type device DN of the inverter INV2 are respectively 0, 0, 0, 2. Therefore, the numbers of the tags A1, A2, B1, and B2 of the inverter INV2 are respectively 1, 0, 1, 2. The numbers of the tags A1, A2, B1, and B2 of the inverters INV3 and INV4 are respectively the same as that of the inverters INV1 and INV2.

In the present embodiments, a p-type device DP of the inverter INV5 has a source and a drain directly/indirectly connected to a high voltage rail, thereby being at a high voltage level, such that the numbers of the tags A1, A2, B1, and B2 of the p-type device DP of the inverter INV5 are respectively 0, 0, 2, 0. An n-type device DN of the inverter INV5 has a drain at high voltage level and a source at low voltage level, such that the numbers of the tags A1, A2, B1, and B2 of the p-type device DP of the inverter INV5 are respectively 0, 1, 0, 1. Therefore, the numbers of the tags A1, A2, B1, and B2 of the inverter INV5 are respectively 0, 1, 2, 1. Similarly, the numbers of the inverters INV6-INV8 are the same as that of the inverter INV5.

embodiments, since the leakage current to the tap region have a larger impact on latch-up issue than the parasitic SCR circuit does, the weighting factors C1 and C2 are greater than the weighting factors assigned to the numbers of the tags B1 and B2 (which are referred to as weighting factors D1 and D2 hereinafter).

In some embodiments, since the leakage currents to the tap regions of different conductive type may have different impacts on latch-up issue, the weighting factor C1 may be different from the weighting factor C2. For example, as shown in Table 1 later, the weighting factor C1 may be less than the weighting factor C2. In some other embodiments, the weighting factor C1 may be substantially equal to or greater than the weighting factor C2. In some embodiments, the weighting factor D1 may be substantially equal to the weighting factor D2. In some other embodiments, since the SCR anodes and SCR cathodes may have different impacts on latch-up issue, the weighting factor D1 may be different from the weighting factor D2. For example, the weighting factor D1 may be less than or greater than the weighting factor D2. In the context, the weighting factors may also be referred to as weighting coefficients. In the context, the scores of the standard cell SC (or the devices DN/DP) may be referred to as sub-scores.

Reference is made to FIG. 2 and FIGS. 3A-3B. In operation S6 of method M, scores of the standard cells SC (or the devices DN/DP) and other devices (e.g., passive devices) are calculated according to the weighting factor rule, and then the scores of the standard cells SC (or the devices DN/DP) in plural regions are added up, respectively. In present embodiments, the numbers of the tags A1, A2, B1, and B2 of the standard cells SC (or the devices DN/DP) are respectively multiplexed by the weighting factors C1, C2, D1, and D2, and then added up, thereby obtaining the scores of the standard cells SC (or the devices DN/DP). For example, a scores of a standard cell SC (or the devices DN/DP) may be represented as a sum of the number of A1*C1, the number of A2*C2, the number of B1*D1, and the number of B2*D2. For example, weighting factors and the scores of the standard cell SC are exemplarily shown in Table 1 below.

TABLE 1

| Standard cell | Input voltage (Vin) | Number of tags | | | | | | | | Total Score |
|---|---|---|---|---|---|---|---|---|---|---|
| | | A1 | A2 | B1 | B2 | C1 | C2 | D1 | D2 | |
| Inverter (INV) | Low | 0 | 1 | 2 | 1 | 10 | 12 | 1 | 1 | 15 |
| | High | 1 | 0 | 1 | 2 | | | | | 13 |

Reference is made to FIG. 2 and FIGS. 3A-3B. In operation S5 of method M, a weighting factor rule regarding the weighting factors assigned to the numbers of the tags A1, A2, B1, and B2 is determined based on the device to tap maximum allowed distance (referring to FIG. 4A-4C) and types of the devices. In some embodiments, when device to tap maximum allowed distance is reduced, the weighting factors assigned to the numbers of the tags A1 and A2 (which are referred to as weighting factors C1 and C2) may be lowered. Therefore, the integrated circuits with less tap pitch P1 may have less scores. In some embodiments, the weighting factors C1 and C2 may be related to a threshold voltage (Vt) of the devices. For example, a p-type device having a larger threshold voltage may have a larger weighting factor C1, and n-type device having a larger threshold voltage may have a larger weighting factor C2. In some In some embodiments, for example, the weighting factors C1 and C2 may be in a range from about 1 to about 20. For example, in some embodiments, the weighting factors C1 and C2 may be in a range of about 5 to about 15. In some embodiments, the weighting factors D1 and D2 may be in a range from about 0 to about 1. For example, the weighting factors D1 and D2 may be 1. In Table 1, the numbers of tags A1 and A2 are respectively multiplexed by 10 and 12, while the numbers of tags B1 and B2 are multiplexed by 1. Through the calculation, each of the inverters INV1, INV3, INV5-INV8 having a low input voltage has a score of 15. Also, each of the inverter INV2 and NOT 4 having a high input voltage has a score of 13.

In the present embodiments, the numbers of tags A1, A2, B1, B2 may have a linear relationship with the score. In some other embodiments, the numbers of tags A1, A2, B1, B2 may have a non-linear relationship with the score. For example, one or more numbers of tags A1, A2, B1, and B2 may be squared, and then respectively multiplexed by the weighting factors C1, C2, D1, and D2, and then added up, thereby obtaining the score.

After the calculating based on the weighting factor rule, the scores of the standard cells SC (or the devices DN/DP) in respective regions are respectively added up, thereby obtaining sum scores of the respective regions. For example, by adding up the scores of four standard cells SC (or the devices DN/DP) in the region in FIG. 5B, the sum score of the region in FIG. 5B is 56, which is obtained by adding up 13*2 and 15*2. Similarly, by adding up the scores of four standard cells SC (or the devices DN/DP) in the region in FIG. 5C, the sum score of the region in FIG. 5C is 60, which is obtained form 15*4. Furthermore, in some examples, a interested region may correspond to an amount of standard cells SC (or the devices DN/DP), and the scores of the amount of standard cells SC (or the devices DN/DP) are added up as the sum score of the region IR. For example, in FIG. 5A, the interested region IR corresponds to four sets of fifteen inverters having low input voltages (e.g., some are included in the eight L/L blocks), the score of the region IR is 900, which is obtained from 15*15*4. For example, when the interested region IR' corresponds to two sets of fifteen inverters having high/low input voltages (e.g., some are included in the four H/L blocks) and two sets of fifteen inverters having low input voltages (e.g., some are included in the four L/L blocks), the score of the region IR' is 870, which is obtained by adding up (13+15)/2*15*2 and 15*15*2. In some other embodiments, the interested region may include any suitable size for accommodating a suitable number of devices. For example, the region IR/IR' to be checked may correspond to one or two blocks. In some other embodiments, the interested region IR/IR' may correspond to a region between adjacent two tap cells.

In some embodiments, since the input voltage Vin of the standard cells SC (or the devices DN/DP) may vary over time according to some IC design, the scores of the standard cells SC (or the devices DN/DP) may be calculated based on time duty ratio. For example, herein, if the standard cell SC (or the device DN/DP) operates with a low input voltage for a first time range T1, and with a high input voltage for a second time range T2, a score of the standard cell SC (or the device DN/DP) may be deemed as a sum of the score of standard cell SC (or the device DN/DP) with a low input voltage multiplied by T1/(T1+T2) and the score of standard cell SC (or the device DN/DP) with a high input voltage multiplied by T2/(T1+T2). For example, if the T1 is 40 milliseconds, T2 is 60 milliseconds, the score of the inverter INV1 is about 13.8, which is obtained from 15*0.4+13*0.6. For example, if the T1 is 50 milliseconds, T2 is 50 milliseconds, the score of the inverter INV1 is about 14, which is obtained from 15*0.5+13*0.5.

Reference is made to FIG. 2 and FIGS. 3A-3B. In operation S7 of method M, a determination is made if a sum score in one of the interested regions is higher than a threshold value. For example, if a sum score of the devices in the one of the interested regions is higher than the threshold value, said one of the interested regions is believed to be a high risk region. If a sum scores of the devices in the one of the interested regions is equal to or less than the threshold value, said one of the interested regions is believed to be a non-risk region. The threshold value may vary according to the weighting factors C1, C2, D1, and D2, the dimension of the interested region IR/IR', the number of the devices, and so on.

In some embodiments, when the interested region IR corresponds to four sets of fifteen inverters (e.g., some are included in eight blocks), the threshold value may be in a range from 880 to 890, for example 890. In the embodiments, the interested region IR corresponding to four sets of fifteen inverters having low input voltages (e.g., some are included in the eight L/L blocks) has the sum score 900 higher than the threshold value of 890, and therefore the interested region IR shown in FIG. 5A is believed to be a high risk region. In the embodiments, the sum score of the interested region IR' corresponding to two sets of fifteen inverters having high/low input voltages (e.g., some are included in four H/L blocks) and two sets of fifteen inverters having low input voltages (e.g., some are included in the four L/L blocks) has the sum score of 870 less than the threshold value of 890, and therefore the interested region IR' is believed to be an non-risk region.

In some other embodiments, when the interested region is about 30 squire micrometers, and adjacent two tap cells has a tap pitch P1 of about 30 micrometers, the threshold value may be in a range from 30000 to 35000. In some other embodiments, when the interested region is about 30 squire micrometers and adjacent two tap cells has a tap pitch P1 of about 15 micrometers, the threshold value may be greater than 35000, for example, may be in a range from 60000 to 70000. In some embodiments, the threshold value may also be designed according to the needs of the device density and latch up immunity. If high device density and low latch up immunity is desired, the threshold value may be increased. If low device density and high latch up immunity is desired, the threshold value may be decreased.

When there is at least one high risk region (e.g., the interested region IR in FIG. 5A), the method M proceeds to the operations S8-1 and/or S8-2, where an adjustment is made to the layout 200 regarding the high risk region.

Figure 6A:
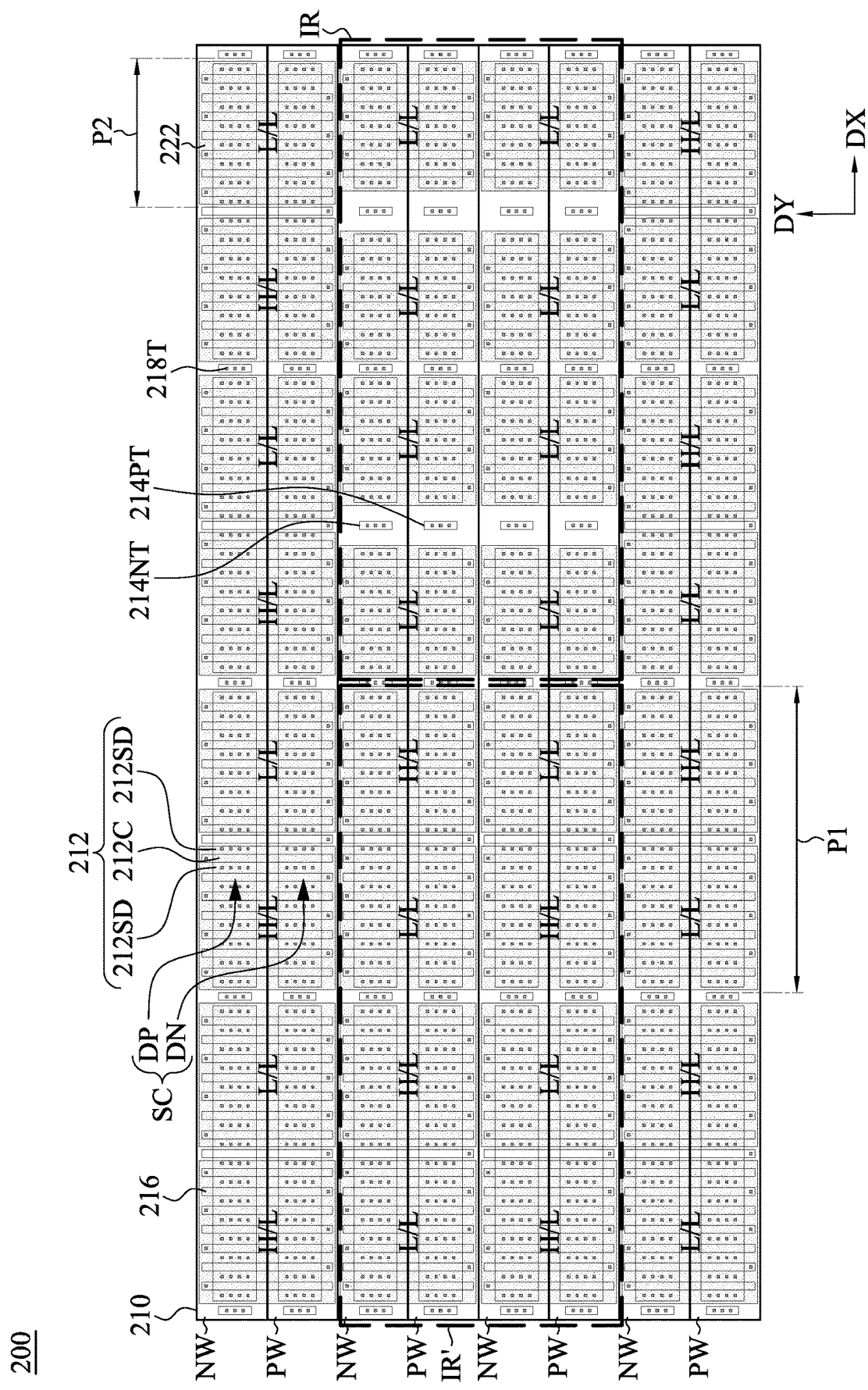
FIG. 6A is a modified layout of the integrated circuit according to some embodiments of the present disclosure.
Figure 6B:
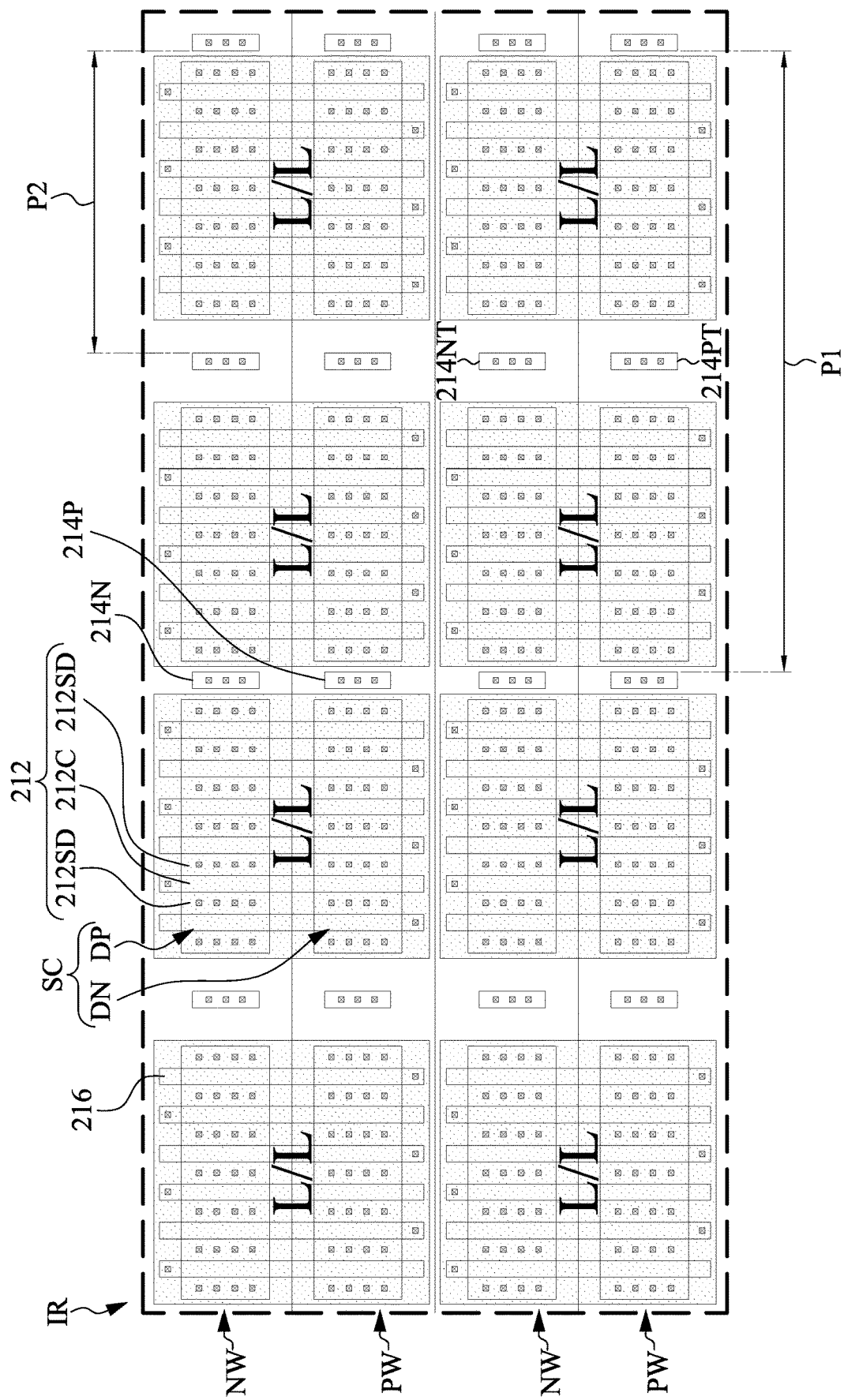
FIG. 6B is an enlarged view of a region of the integrated circuit of FIG. 6A.

Reference is made to FIGS. 2, 6A, and 6B. FIG. 6A is a modified layout of the integrated circuit according to some embodiments of the present disclosure. FIG. 6B is an enlarged view of the interested region IR of the integrated circuit of FIG. 6A. The method M proceeds to the operations S8-1 where the adjustment may be made to the first layout 210 by adding inter tap regions 214NT/214PT. In the present embodiments, the inter tap regions 214NT/214PT are inserted to the high risk region (e.g., the interested region IR) in the first layout 210. Through the addition of the inter tap regions 214NT/214PT, the distance from a device DN/DP to a tap region 214P/214PT/214N/214NT is reduced, such that it is less easy to trigger the parasitic, thereby avoiding the latch-up.

In some embodiments, prior to adding the inter tap regions 214NT/214PT, some of the devices DP/DN (e.g., three gate structures 216 and portions of the active regions 212) are removed from the high risk region (e.g., the interested region IR), thereby leaving spaces for accommodating the inter tap regions 214NT/214PT. After adding the inter tap regions 214NT/214PT, some adjacent two of the tap regions 214N/214P in the high risk region (e.g., the interested region IR) spaced by the pitch P1 in the direction DX has an inter tap region 214NT/214PT therebetween, and another adjacent two of the tap regions 214N/214P in the non-risk region (e.g., the interested region IR') spaced by the pitch P1 in the direction DX has no inter tap region therebetween. In some embodiments, each of the inter tap regions 214NT/214PT are between and immediately adjacent to the devices DN/DP.

Through this adjustment, the n-type tap regions 214N and 214NT are arranged with different pitches. For example, in the present embodiments, adjacent two of the n-type tap regions in a first row (e.g., two tap regions 214N) has the pitch P1 in the direction DX, adjacent two of the n-type tap regions in a second row (e.g., one tap region 214N and one inter tap region 214NT) has a pitch P2 in the direction DX, and the pitch P1 is greater than the pitch P2. Therefore, a number of the devices DP between said adjacent two of the n-type tap regions in the first row (e.g., two tap regions 214N) is greater than a number of the devices DP between said adjacent two of the n-type tap regions in the second row (e.g., one tap region 214N and one inter tap region 214NT).

Similarly, the p-type tap regions 214P and 214PT are arranged with different pitches. For example, in the present embodiments, adjacent two of the p-type tap regions in a first row (e.g., two tap regions 214P) has the pitch P1 in the direction DX, adjacent two of the p-type tap regions in a second row (e.g., one tap region 214P and one inter tap region 214PT) has the pitch P2 in the direction DX, and the pitch P1 is greater than the pitch P2. Therefore, a number of the devices DN between said adjacent two of the p-type tap regions in the first row (e.g., two tap regions 214P) is greater than a number of the devices DN between said adjacent two of the p-type tap regions in the second row (e.g., one tap region 214P and one inter tap region 214NP).

Figure 7:
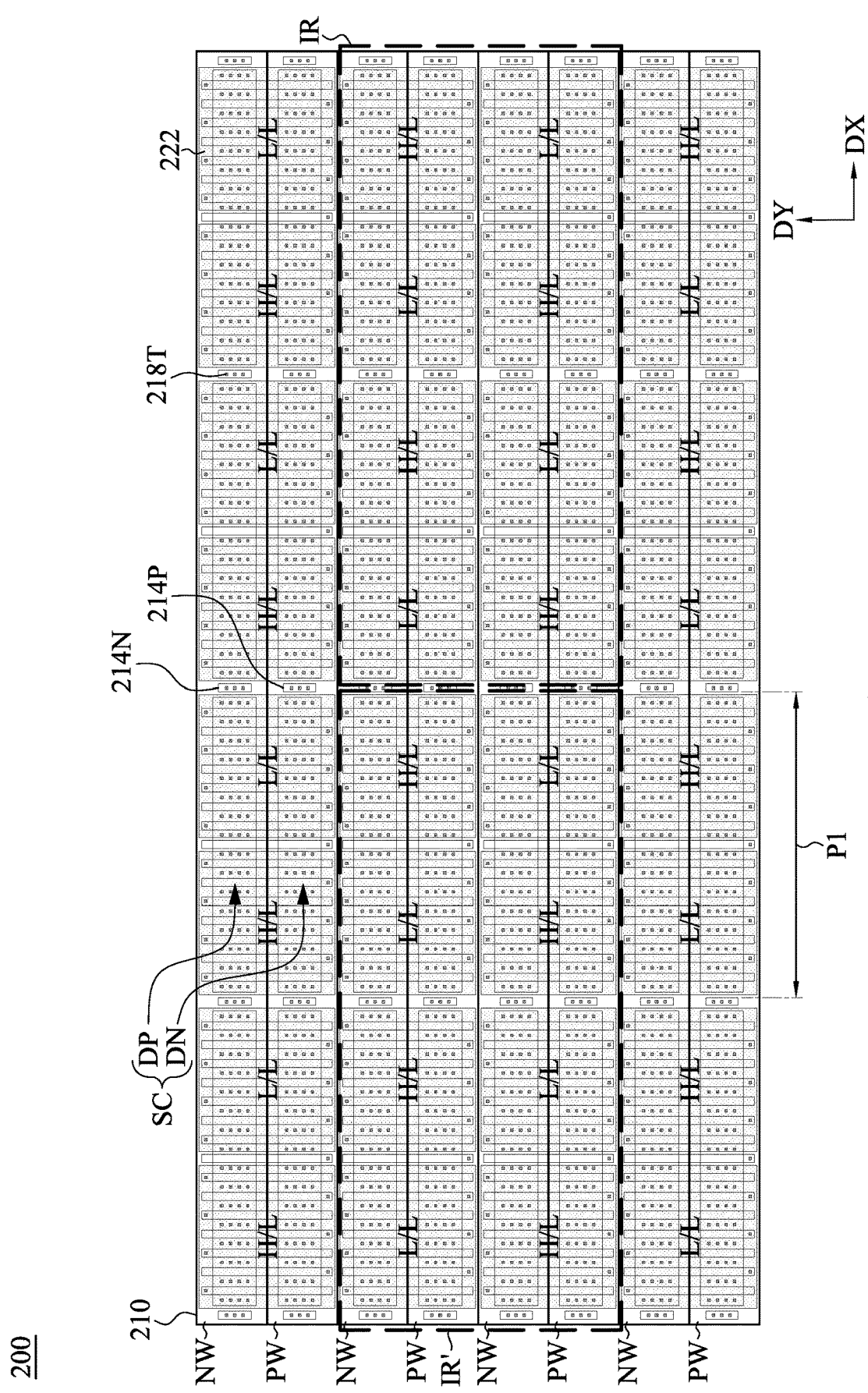
FIG. 7 is a modified layout of the integrated circuit according to some embodiments of the present disclosure.

Reference is made to FIGS. 2 and 7. FIG. 7 is a modified layout of the integrated circuit according to some embodiments of the present disclosure. The method M proceeds to the operations S8-2 where the adjustment may be made to the second layout by adjusting a metallization pattern in the BEOL layout (e.g., the BEOL blocks 222) connected to the devices DN/DP in the high risk region (e.g., the interested region IR). In the present embodiments, the adjustment to the BEOL layout is performed such that input voltages of the standard cells SC are changed while IC design 104 can still be realized. Through the adjustment to the BEOL layout, the L/L blocks 222 in the region IR are changed to be H/L blocks. That is, the adjustment to the BEOL layout is performed such that the input voltages of some of the standard cells SC in the region IR is changed from a low voltage to a high voltage. Through the configuration, the number of the tag A1 of the drains of the p-type devices DP at low voltage (referring to FIG. 3A) is decreased, thereby lowering the score of the interested region IR. In some other embodiments, the adjustment to the BEOL layout may be performed such that the input voltages of some of the standard cells SC in the region IR is changed from a high voltage to a low voltage. In the present embodiments, the adjustment to the layout 200 at the operation S8-2 may not change the configuration of the devices DN/DP, the tap regions 214N/214P, and the contacts in the first layout 210 generated by the floorplanning method.

In some other embodiments, the adjustment to the layout 200 may include both inserting inter tap regions 214NT/214PT in high risk region (e.g., the region IR) in the first layout 210 as shown in FIGS. 6A and 6B and adjusting a metallization pattern in a BEOL layout (e.g., the BEOL blocks 22) connected to the devices DN/DP in the high risk region (e.g., the region IR) as shown in FIG. 7.

By the adjustment to the layout 200 (e.g., the operations S8-1 and S8-2), the region IR is adjusted to have a lowered score. For example, after the operations S8-1 and S8-2, the method M may proceed back to repeat the operations S4 and S5.

In furtherance, in some embodiments where the inter tap regions 214NT/214PT are inserted into the high risk region as shown in FIGS. 6A and 6B at the operation S8-1, the weighting factors determined at the operation S5 are decreased, such that the interested region IR may have a score lower than the threshold value. For example, the weighting factors C1 and C2 are changed from 10 and 12 respectively to 8 and 10 by adding the inter tap regions 214NT/214PT, and the standard cells SC which a low input voltage are changed to have a score of 13 such that the region IR may have a score of 780 obtained from 13*15*4, which is lower than the threshold value of 890. On the other hand, at the operation S8-1, the scores of other interested regions without the additional inter tap regions 214NT/214PT (e.g., the interested region IR') may be calculated based on unchanged weighting factors, and therefore remains unchanged.

In some embodiments where some of the standard cells SC in the high risk region is changed from having a low input voltage to having a high input voltage as shown in FIG. 7 at the operation S8-2, the interested region IR is changed to correspond with four H/L blocks and four L/L blocks, and therefore the numbers of the tags A1, A2, B1, B2 in the region IR obtained at the operation S4 is changed and lowered. For example, the region IR may turn to have a score of 870 lower than the threshold value of 890.

By the operations S8-1, S8-2, S4, and S5, the interested region IR is adjusted to have a lowered score. When the lowered score of the interested region IR is equal to or less than the threshold value, the interested region IR is believed to a non-risk region.

In some embodiments, when the scores of some or all the interested regions in the layout 200 are equal to or less than the threshold value (e.g., no high risk region in the layout 200), the method M proceeds to the operation S9, where the layout 200 including the first layout 210 and the BEOL layout (e.g., the blocks 222) is outputted.

Figure 8:
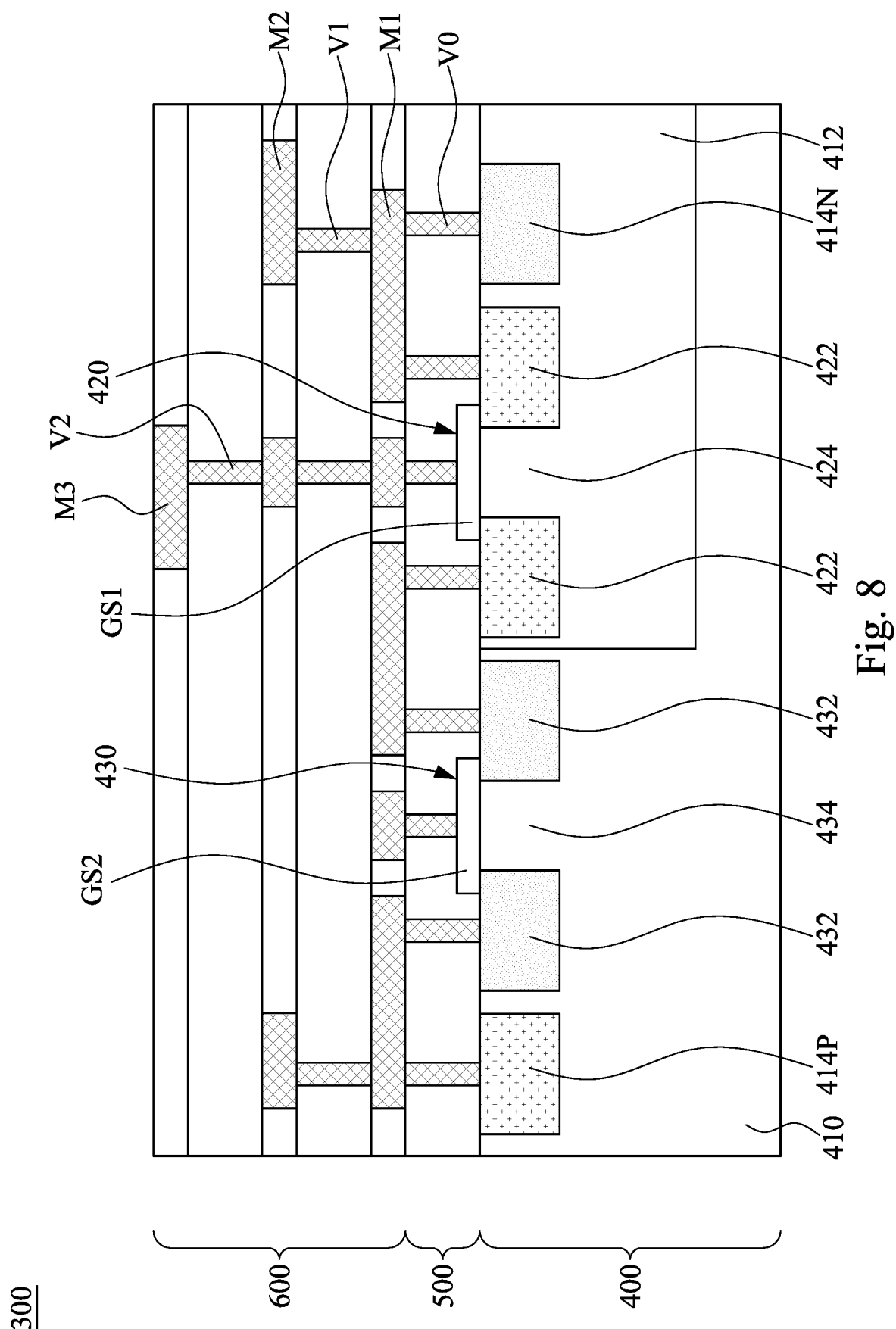
FIG. 8 is a schematic cross-sectional view of a semiconductor device according to some embodiments of the present disclosure.

Then, the method M proceeds to the operation S10, where a semiconductor wafer is fabricated according to the outputted layout 200 including the first layout 210 and the BEOL layout (e.g., the blocks 222), thereby obtaining semiconductor devices 300 as shown in FIG. 8.

FIG. 8 is a schematic cross-sectional view of the semiconductor device 300 according to some embodiments of the present disclosure. In some embodiments, the semiconductor device 300 include a FEOL structure 400, a MEOL structure 500, and a BEOL structure 600. In some embodiments, the FEOL structure 400 includes a p-type substrate 410, an n-type well 412, a p-type tap region 414P, an n-type tap region 414N, a p-type device 420, and an n-type device 430. The n-type well 412 may include a lightly-doped region in the p-type substrate 410. The p-type tap region 414P may include a heavily-doped region in the p-type substrate 410. The n-type tap region 414N include a heavily-doped region in the n-type well 412. The p-type device 420 includes source/drain regions 422 in the n-type well 412, a channel region 424 between the source/drain regions 422, and a gate structure GS1 over the channel region 424. The n-type device 430 includes source/drain regions 432 in the p-type substrate 410, a channel region 434 between the source/drain regions 432, and a gate structure GS2 over the channel region 434. The MEOL structure 500 may include contacts V0 connected to the gate structures GS1 and GS2, the source/drain regions 422 and 432. The BEOL structure 600 may include suitable metallization pattern (e.g., plural metal layers M1-M3 and metal vias V1-V2) connected to the p-type device 420, the n-type device 430, and the tap regions 414N/414P, thereby forming standard cells, such as logic gate cells (e.g., the invertor).

In some embodiments, one or more reticles (interchangeably referred to as photomasks) are generated according to the outputted layout 200 during the fabrication process of the semiconductor device 300. Therefore, features of the semiconductor device 300 may be formed by one or more photolithography processes through these reticles. In some other embodiments, a reticle is generated according to the active region 212 of the first layout 200, and a photoresist over the substrate 410 is patterned by exposure through the reticle. An etching process may be performed to the substrate 410 through the patterned photoresist thereby forming recesses in the substrate 410. isolation features (e.g., silicon oxide or other suitable dielectric material) may be formed recesses in the substrate 410, thereby defining active regions in the substrate 410.

For example, in some embodiments, a reticle is generated according to the layout of gate structures 216 of the first layout 200, and a photoresist over a polysilicon layer is patterned by exposure through the reticle. The patterned photoresist may cover first portions of the polysilicon layer and expose second portions of the polysilicon layer. The exposed second portions of the polysilicon layer may then be removed by suitable etching process. The remaining first portions of the polysilicon layer may act as dummy gates and later be replaced with gate structures GS1 and GS2, each of which may include a high k dielectric and a metal gate.

For example, in some embodiments, a reticle is generated according to the doped regions (e.g., the wells NW, the wells PW, n-type source/drain region 212SD and n-type tap region 214N and 214NT, or p-type source/drain region 212SD and p-type tap region 214P and 214PT) of the layout 200, a photoresist over the substrate 410 is patterned by exposure through the reticle. The patterned photoresist may cover first portions of the substrate 410 and expose second portions of the substrate 410. The exposed second portions of the substrate 410 are then doped to form the desired doped regions, such as n-type well 412, n-type source/drain region 422 and n-type tap region 414N or p-type source/drain region 422 and p-type tap region 414P.

In some embodiments, the operations S1-S9 described with respect to FIG. 2 are realized as functions of a program stored in a non-transitory computer readable recording medium, for example, in the memory 1102 in FIG. 1B. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. In some embodiments, the operations S1-S9 described with respect to FIG. 2 are implemented by specially configured hardware component 1106 in FIG. 1B separated from or in lieu of the processor 1101 in FIG. 1B. In some embodiments, the specially configured component 1106 in FIG. 1B may be one or more application-specific integrated circuits or ASIC(s).

In some embodiments, the operations S2-S9 described with respect to FIG. 2 may be performed by user. For example, the user tags the devices, counts the number of the tags, and calculating the scores of the devices in respective interested regions to perform the operation S3, S4, S6. Then, the user makes a determination on whether the score of at least one of the interested regions is higher than a threshold value at the operation S7, and gives the commands to the layout pattern design system 110 to adjust the layout at the operations S8-1 and S8-2 according to the determination result. For example, the input device of the I/O device 1105 may receive the user's commands and send the commands to the processor 1101, such that the processor 1101 performs the adjustment to the layout.

Figure 9A:
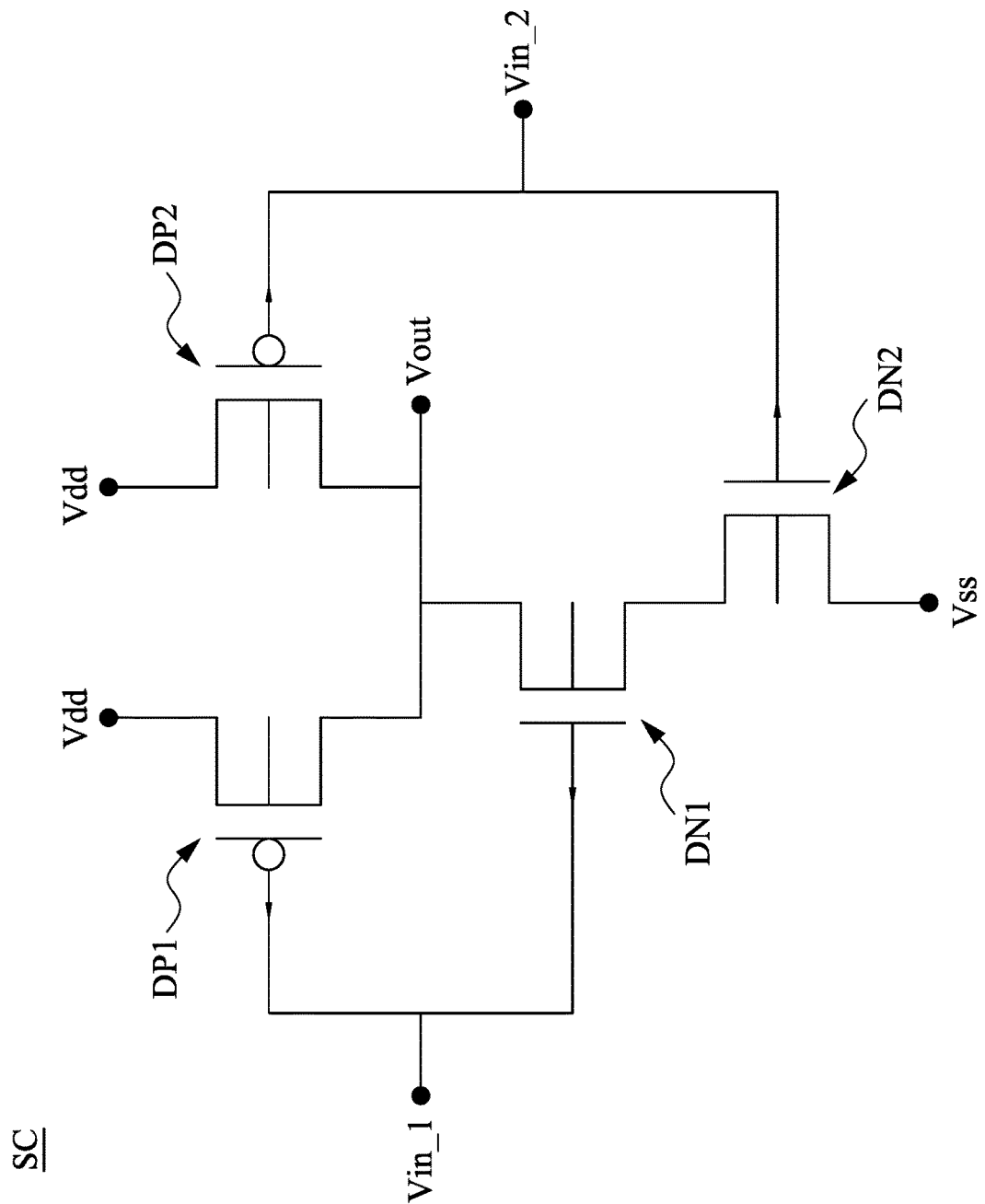
FIG. 9A is a circuit diagram of an integrated circuit according to some embodiments of the present disclosure.
Figure 9B:
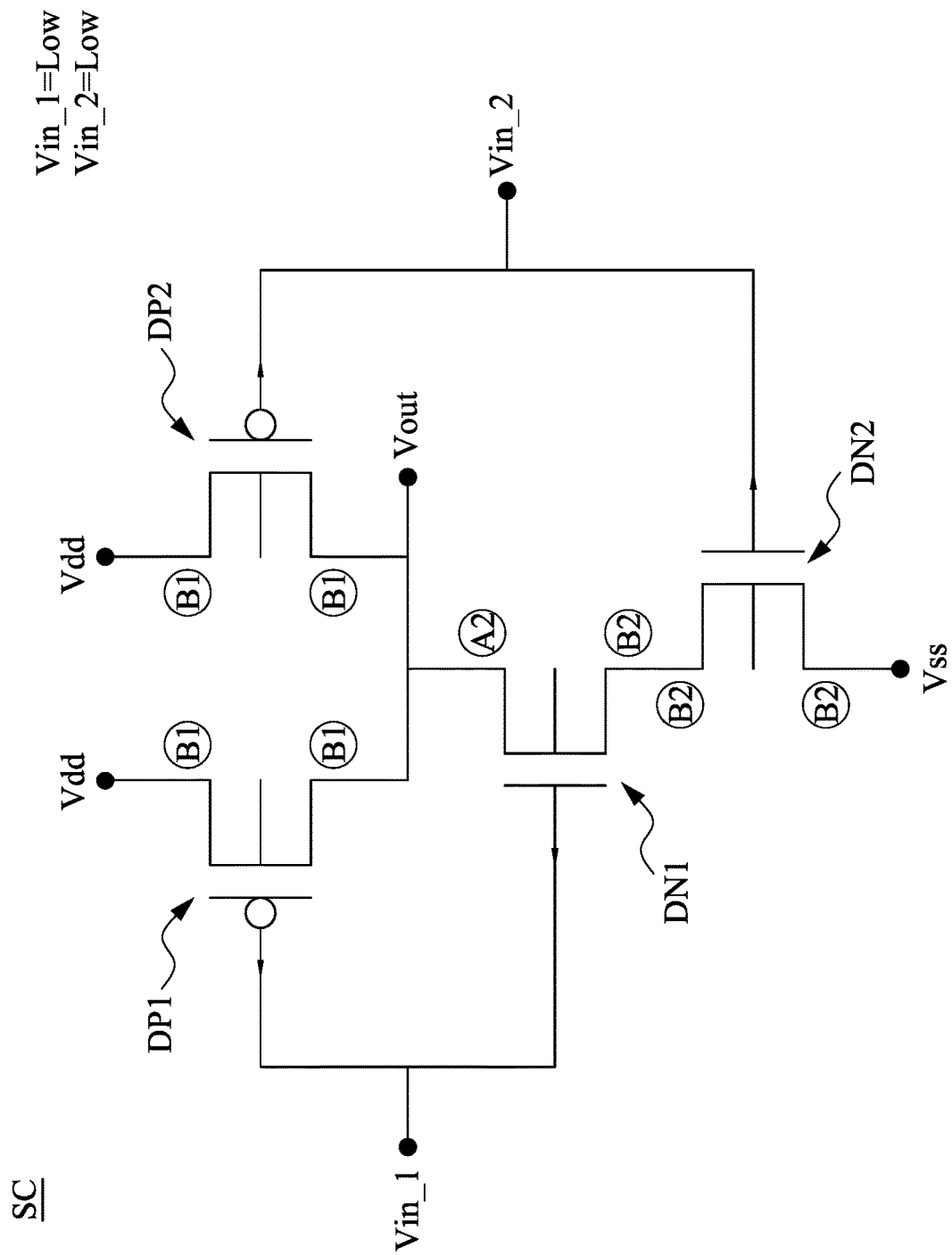
FIGS. 9B-9E are tagged results according to the circuit diagram of FIG. 9A.
Figure 9C:
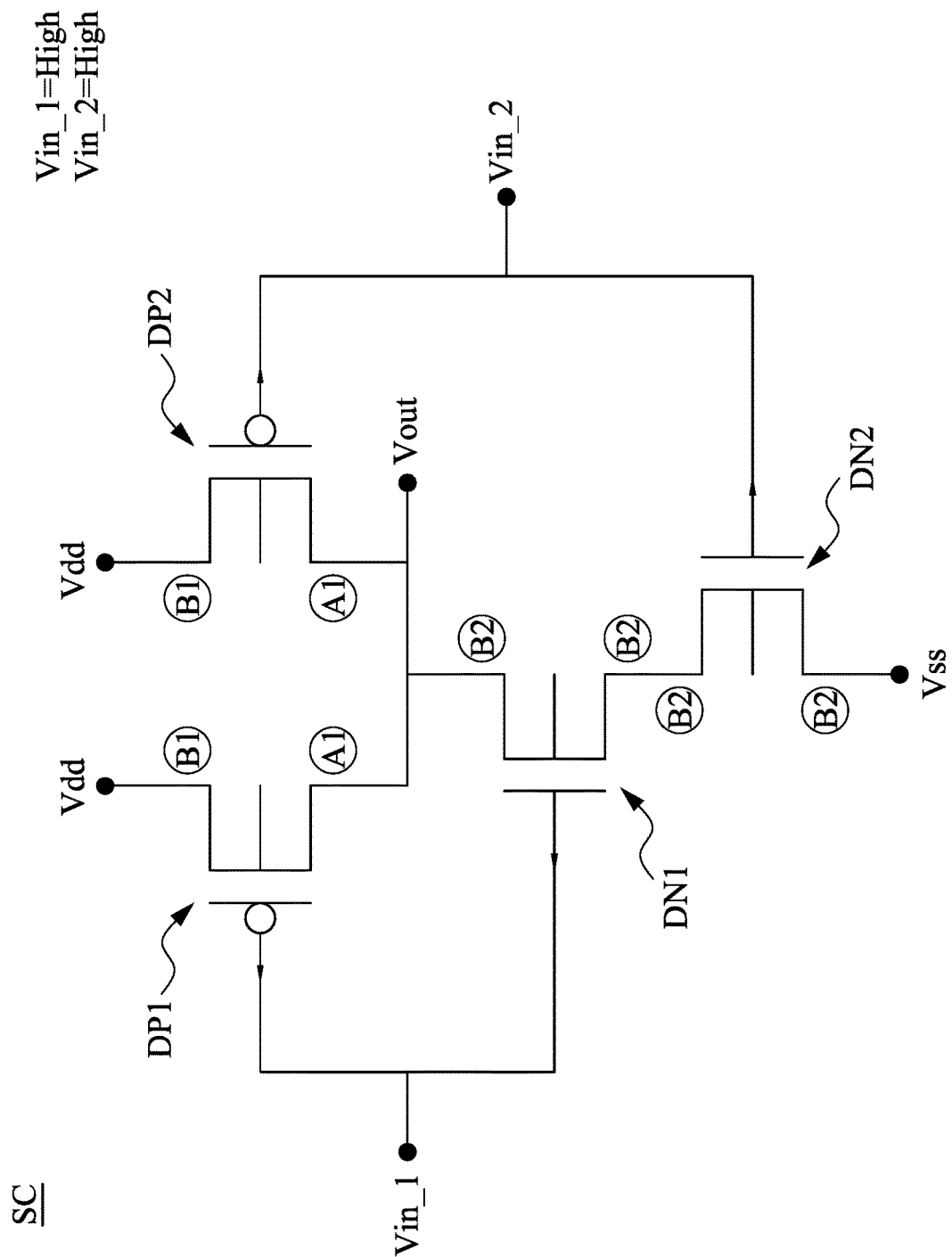
Figure 9D:
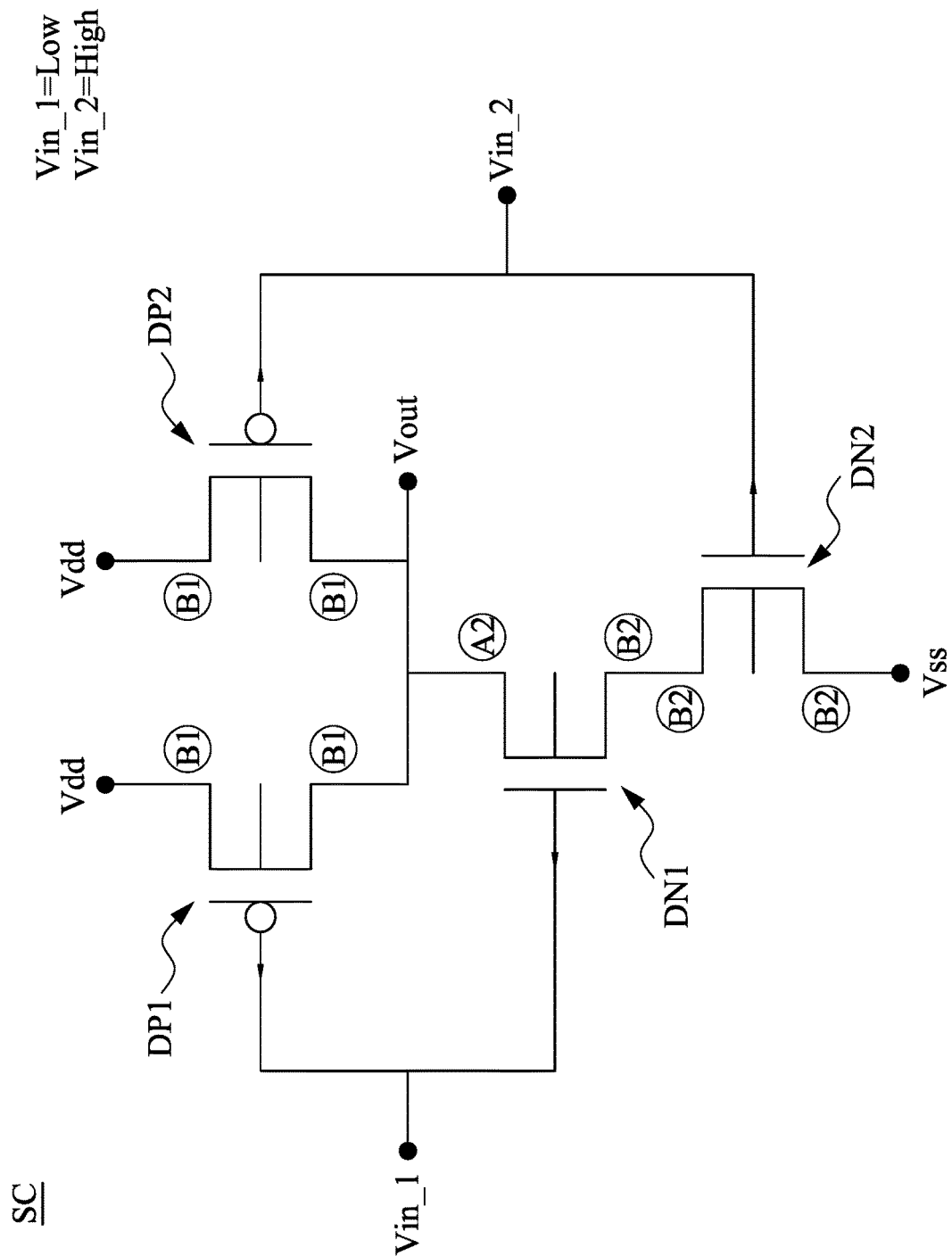
Figure 9E:
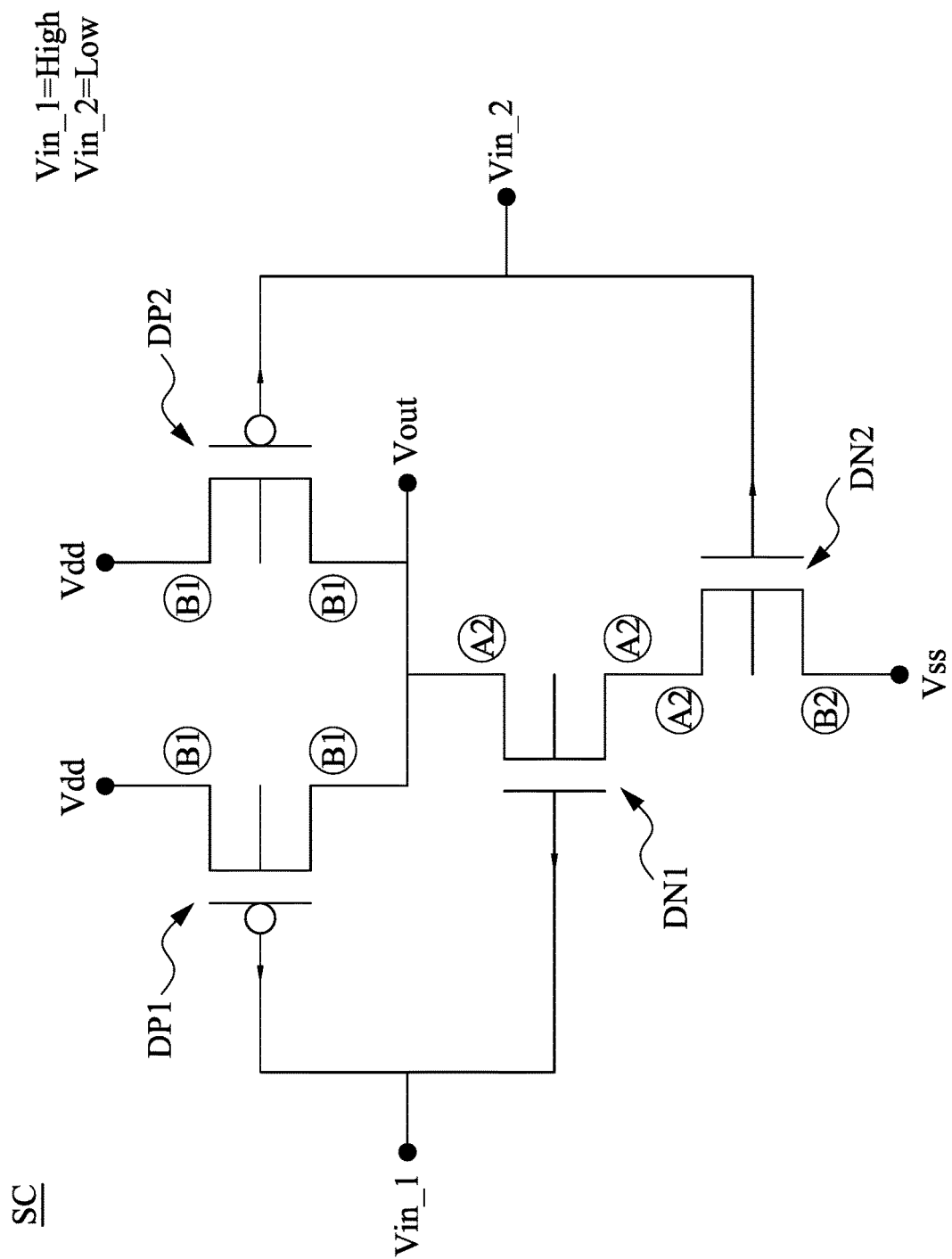

FIG. 9A is a circuit diagram of an integrated circuit according to some embodiments of the present disclosure. FIGS. 9B-9E are tagged results according to the circuit diagram of FIG. 9A. The present embodiments are similar to the embodiments of FIGS. 3A-8, except the illustrated standard cell SC is a NAND gate in the present embodiments. In the present embodiments, the NAND gate has two p-type devices DP1 and DP2 and two n-type devices DN1 and DN1. The p-type devices DP1 and DP2 have source at high voltage level (e.g., connected to the high power rail Vdd), and the n-type device DN2 has a source at low voltage level (e.g., connected to the low power rail Vss). The scores of the NAND gate is exemplarily shown in Table 2 above, in which the weighting factors C1 and C2 are respectively equal to 10 and 12, the weighting factors D1 and D2 are equal to 1.

TABLE 2

| Standard cell | Input voltage (Vin_1/Vin_2) & static state | Number of tags | | | | | | | | Total Score |
|---|---|---|---|---|---|---|---|---|---|---|
| | | A1 | A2 | B1 | B2 | C1 | C2 | D1 | D2 | |
| NAND | Low/Low static@High | 0 | 1 | 4 | 3 | 10 | 12 | 1 | 1 | 19 |
| | High/High static@Low | 2 | 0 | 2 | 4 | | | | | 26 |
| | Low/High static@High | 0 | 1 | 4 | 3 | | | | | 29 |
| | High/Low static@High | 0 | 3 | 4 | 1 | | | | | 19 |

To be specific, when two input voltages Vin_1 and Vin_2 of the NAND gate are at low voltage level (e.g., connected to the low power rail Vss), the two p-type devices DP1 and DP2 have sources at high voltage level and drains at high voltage level, the n-type device DN1 has a drain at high voltage level and a source at low voltage level, and the n-type device DN2 has a source and a drain at low voltage level. Therefore, the numbers of tags A1, A2, B1, and B2 of the NAND gate with low input voltages Vin_1 and Vin_2 are respectively 0, 1, 4, 3. According to the calculation based on the weighting factor rule, the NAND gate with low input voltages has a score of 19. In some embodiments, when two input voltages Vin_1 and Vin_2 of the NAND gate are at high voltage level (e.g., connected to the high power rail Vdd), the two p-type devices DP1 and DP2 have sources at high voltage level and drains at low voltage level, the n-type device DN1 has a source and a drain at low voltage level, and the n-type device DN2 has a source and a drain at low voltage level. Therefore, the numbers of tags A1, A2, B1, and B2 of the NAND gate with high input voltages Vin_1 and Vin_2 are respectively 2, 0, 2, 4. According to the calculation based on the weighting factor rule, the NAND gate with high input voltages has a score of 26.

In some embodiments, the input voltage Vin_1 of the NAND gate may be at low voltage level (e.g., connected to the low power rail Vss), and the input voltage Vin_2 of the NAND gate may be at high voltage level (e.g., connected to the high power rail Vdd). By counting the numbers of tags A1, A2, B1, and B2 and calculating according to the weighting factor rule, the NAND gate with high/low input voltages has a score of 29. In some embodiments, the input voltage Vin_1 of the NAND gate may be at high voltage level (e.g., connected to the high power rail Vdd), and the input voltage Vin_2 of the NAND gate may be at low voltage level (e.g., connected to the low power rail Vss). By counting the numbers of tags A1, A2, B1, and B2 and calculating according to the weighting factor rule, the NAND gate with low/high input voltages has a score of 19.

In some embodiments, the weighting factors C1 and C2 of the NAND gate are greater than the weighting factors D1 and D2 of the NAND gate. In some embodiments, the weighting factors C1, C2, D1, D2 of the NAND gate may be similar to the weighting factors C1, C2, D1, D2 of the inverter as shown in the embodiments of FIGS. 3A-7. For example, the weighting factors C1 and C2 may be greater than about 1 and smaller than about 20, and the weighting factors D1 and D2 may be in a range from about 0 to about 1. In some embodiments, the weighting factors C1, C2, D1, D2 of the NAND gate may be different from the weighting factors C1, C2, D1, D2 of the inverter as shown in the embodiments of FIGS. 3A-7.

In some embodiments, since the input voltage of the standard cell SC may vary over time, the scores of the standard cell SC may be calculated based on duty ratio. For example, herein, if the NAND gate operates with input voltages Vin_1/Vin_2 at low/low for a time range T1, at high/high for a time range T2, at low/high for a time range T3, and at high/low for a time range T4, a score of the NAND gate may be deemed as a sum of the score of NAND gate with low/low input voltages multiplied by T1/(T1+T2+T3+T4), the score of NAND gate with high/high input voltages multiplied by T2/(T1+T2+T3+T4), the score of NAND gate with low/high input voltages multiplied by T3/(T1+T2+T3+T4), and the score of NAND gate with high/low input voltages multiplied by T4/(T1+T2+T3+T4). For example, if the time ranges T1 to T4 are respectively 40, 60, 80, 20 milliseconds, the score of the NAND gate is about 25.1. For example, if the time ranges T1 to T4 are respectively 50, 50, 50, 50 milliseconds, the score of the NAND gate is about 23.25.

Figure 10A:
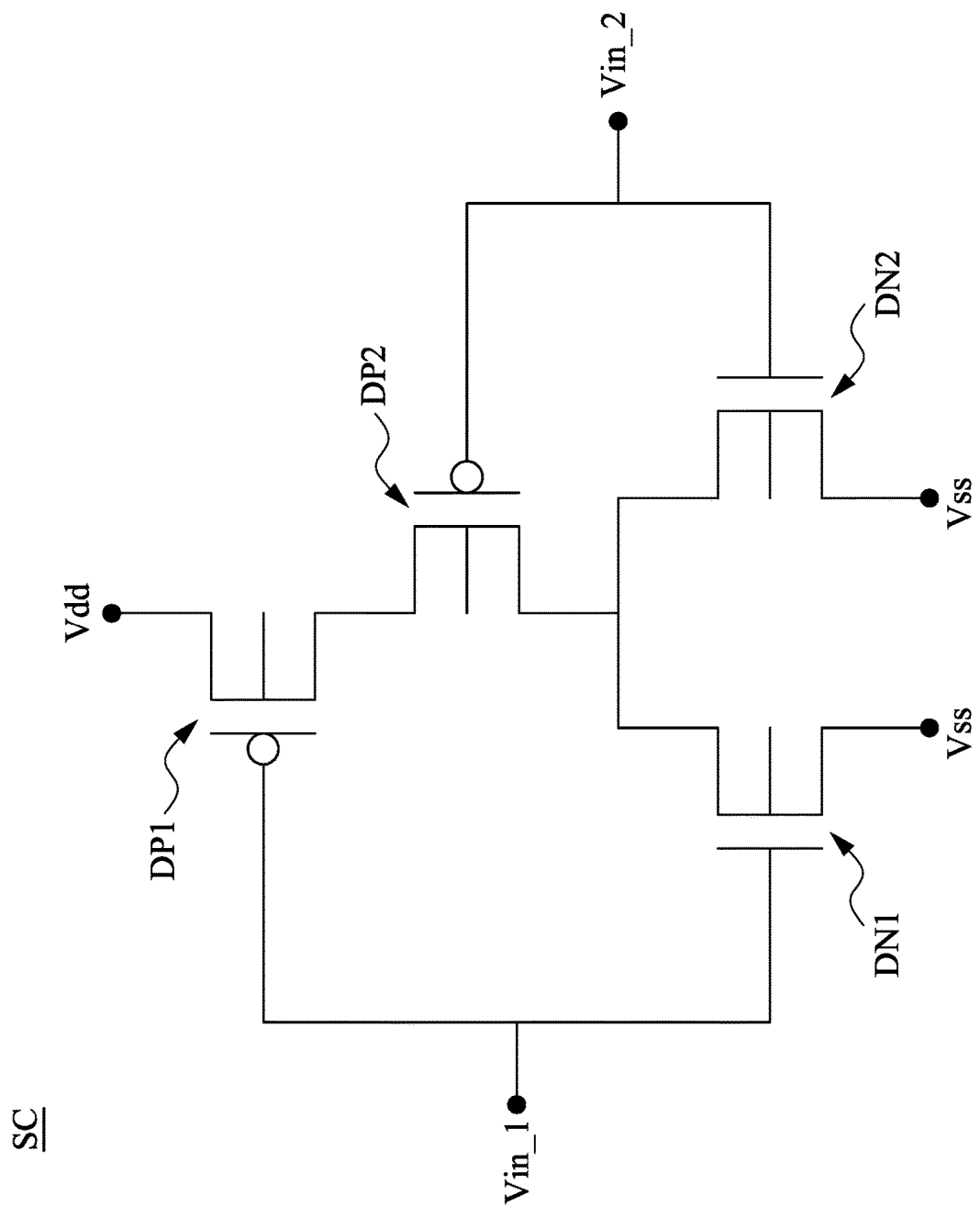
FIG. 10A is a circuit diagram of an integrated circuit according to some embodiments of the present disclosure.

FIG. 10A is a circuit diagram of an integrated circuit according to some embodiments of the present disclosure. FIGS. 10B-10E are tagged results according to the circuit diagram of FIG. 10A. The present embodiments are similar to the embodiments of FIGS. 3A-8, except the illustrated standard cell SC is a NOR gate in the present embodiments. In the present embodiments, the NOR gate has two p-type devices DP1 and DP2 and two n-type devices DN1 and DN2. The p-type device DP1 has a source at high voltage level (e.g., connected to a high power rail Vdd), and the n-type devices DN1 and DN2 has sources at low voltage level (e.g., connected to a low power rail Vss). The scores of the NOR gate is exemplarily shown in Table 3 above, in which the weighting factor C1 and C2 are respectively equal to 10 and 12, the weighting factors D1 and D2 are equal to 1.

TABLE 3

| Standard cell | Input voltage (Vin_1/Vin_2) & static state | A1 | A2 | B1 | B2 | C1 | C2 | D1 | D2 | Total Score |
|---|---|---|---|---|---|---|---|---|---|---|
| NOR | Low/Low static@High | 0 | 2 | 4 | 2 | 10 | 12 | 1 | 1 | 30 |
| | High/High static@Low | 1 | 0 | 1 | 4 | | | | | 15 |
| | Low/High static@Low | 1 | 0 | 3 | 4 | | | | | 17 |
| | High/Low static@Low | 3 | 0 | 1 | 4 | | | | | 35 |

Figure 10B:
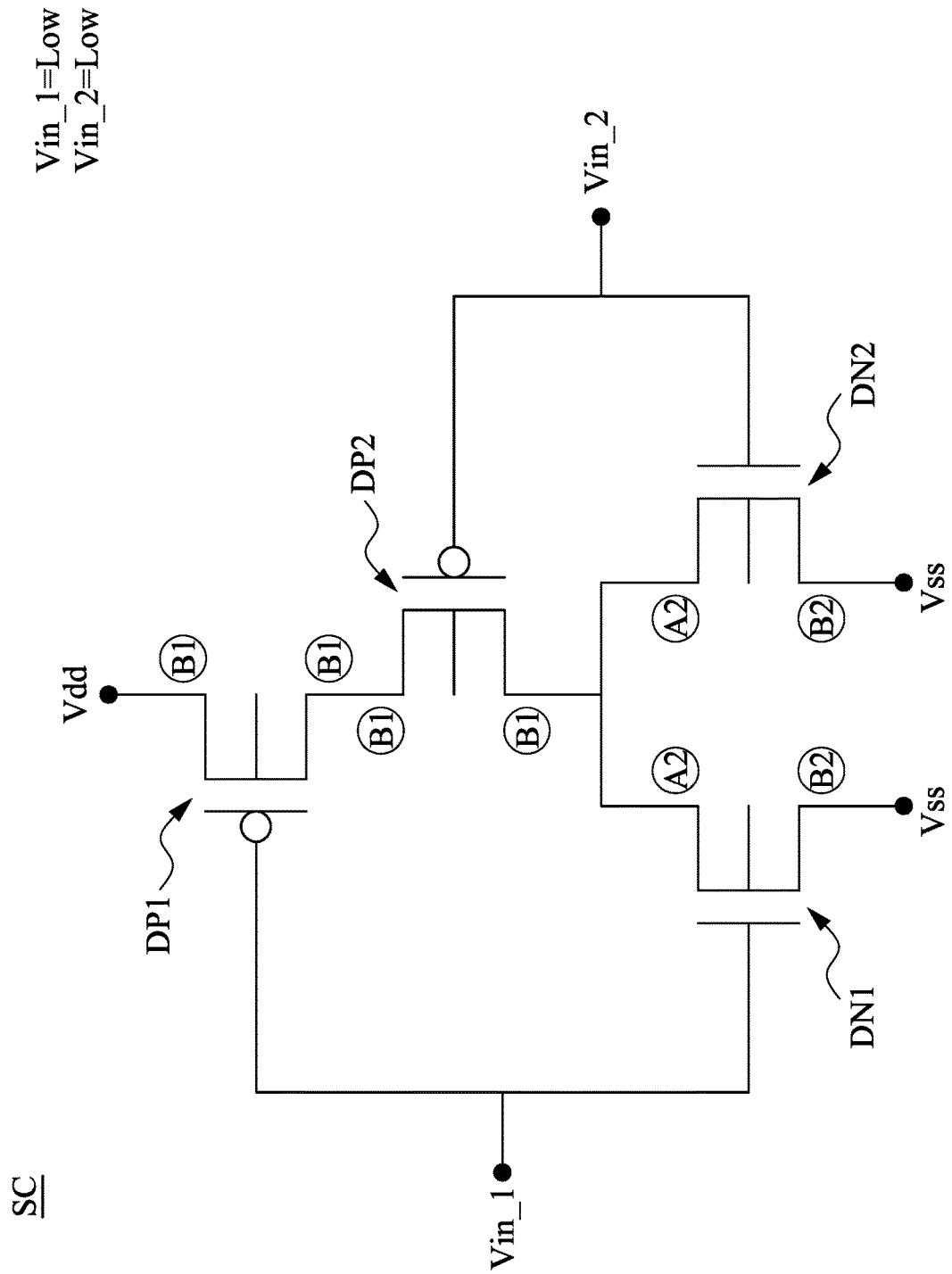
FIGS. 10B-10E are tagged results according to the circuit diagram of FIG. 10A.
Figure 10C:
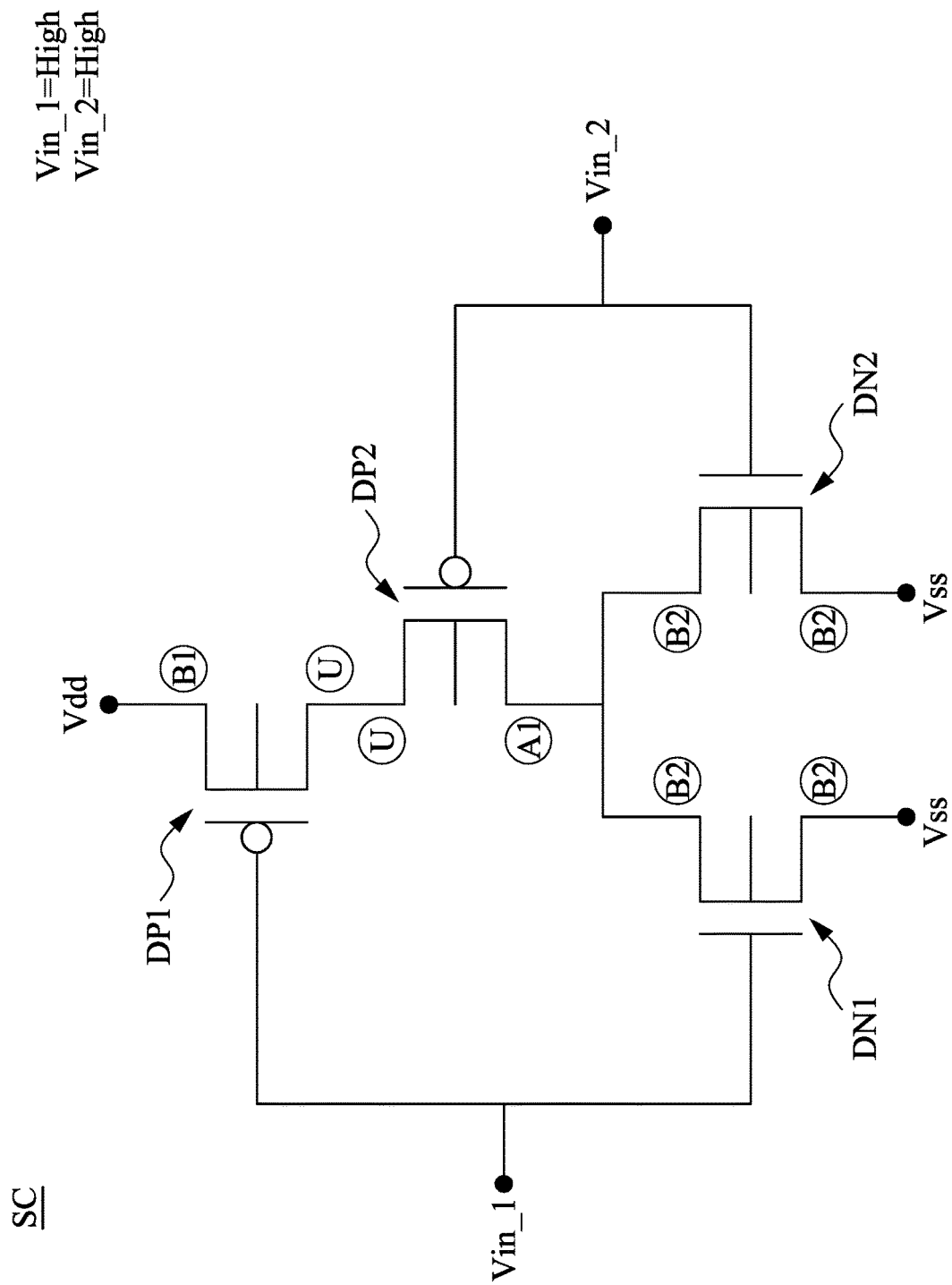

To be specific, referring to FIG. 10B, when two input voltages Vin_1 and Vin_2 of the NOR gate are at low voltage level, the two p-type devices DP1 and DP2 have sources and drains at high voltage level, and the n-type devices DN1 and DN2 have drains at high voltage level and sources at low voltage level (e.g., connected to the low power rail Vss). Therefore, the numbers of tags A1, A2, B1, and B2 of the NOR gate with low input voltages Vin_1 and Vin_2 are respectively 0, 2, 4, 2. According to the calculation based on the weighting factor rule, the NOR gate with low input voltages has a score of 30. In some embodiments, referring to FIG. 10C, when two input voltages Vin_1 and Vin_2 of the NOR gate are at high voltage level (e.g., connected to the high power rail Vdd), the p-type devices DP1 has a source at high voltage level, the p-type devices DP2 have a drain at low voltage level, and the n-type devices DN1 and DN2 have sources and drains at low voltage level. Therefore, the numbers of tags A1, A2, B1, and B2 of the NOR gate with high input voltages Vin_1 and Vin_2 are respectively 1, 0, 3, 4. According to the calculation based on the weighting factor rule, the NOR gate with high input voltages has a score of 17. Herein, tags U are assigned to a drain of the p-type devices DP1 and a source of the p-type devices DP2 since the voltages of these nodes are unknown. In some embodiments, the numbers of the tags U may not be counted when counting the numbers of tags. In some other embodiments, the numbers of the tags U may be counted, and the weighting factor assigned to the number of the tags U is zero.

Figure 10D:
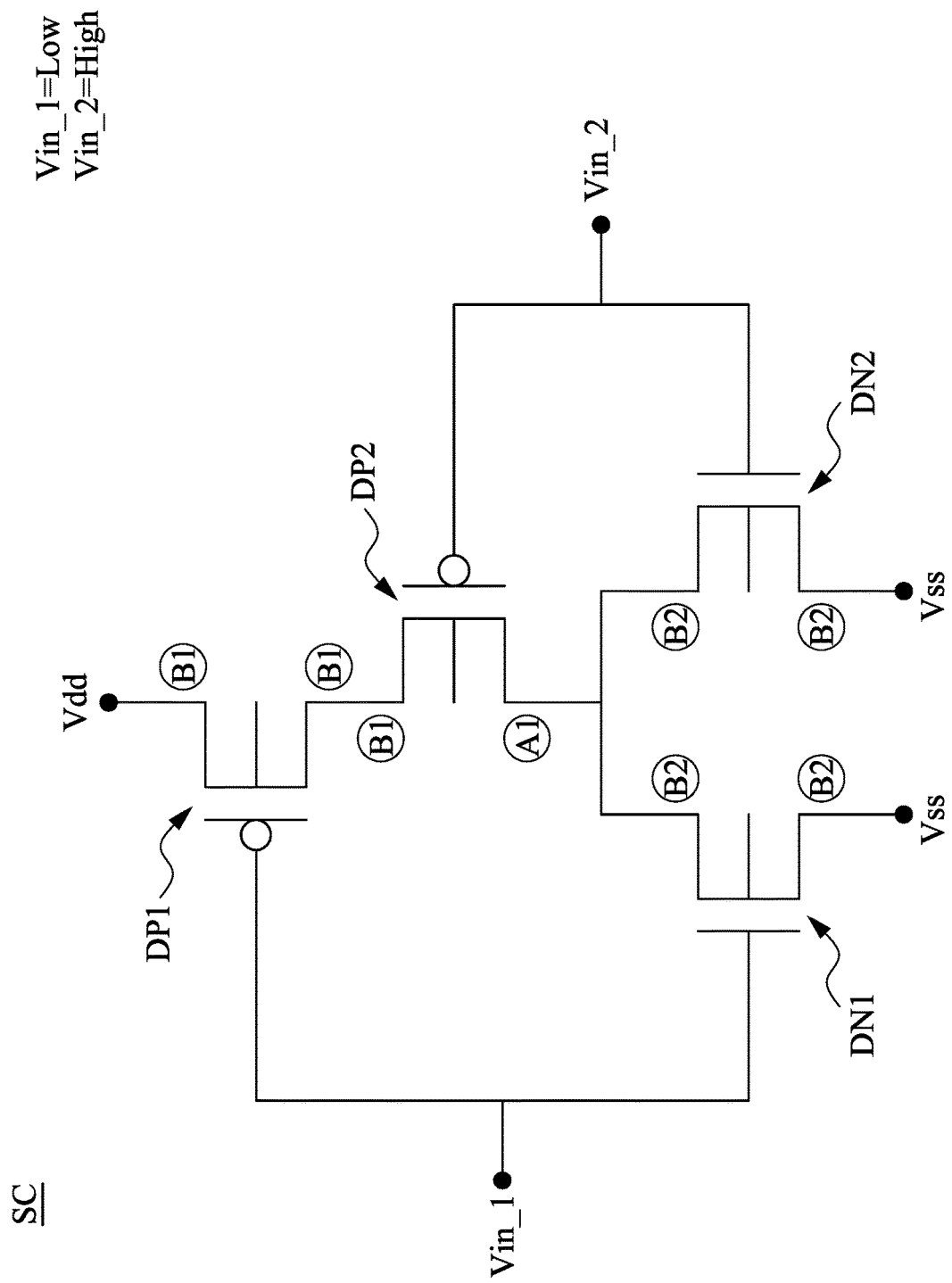
Figure 10E:
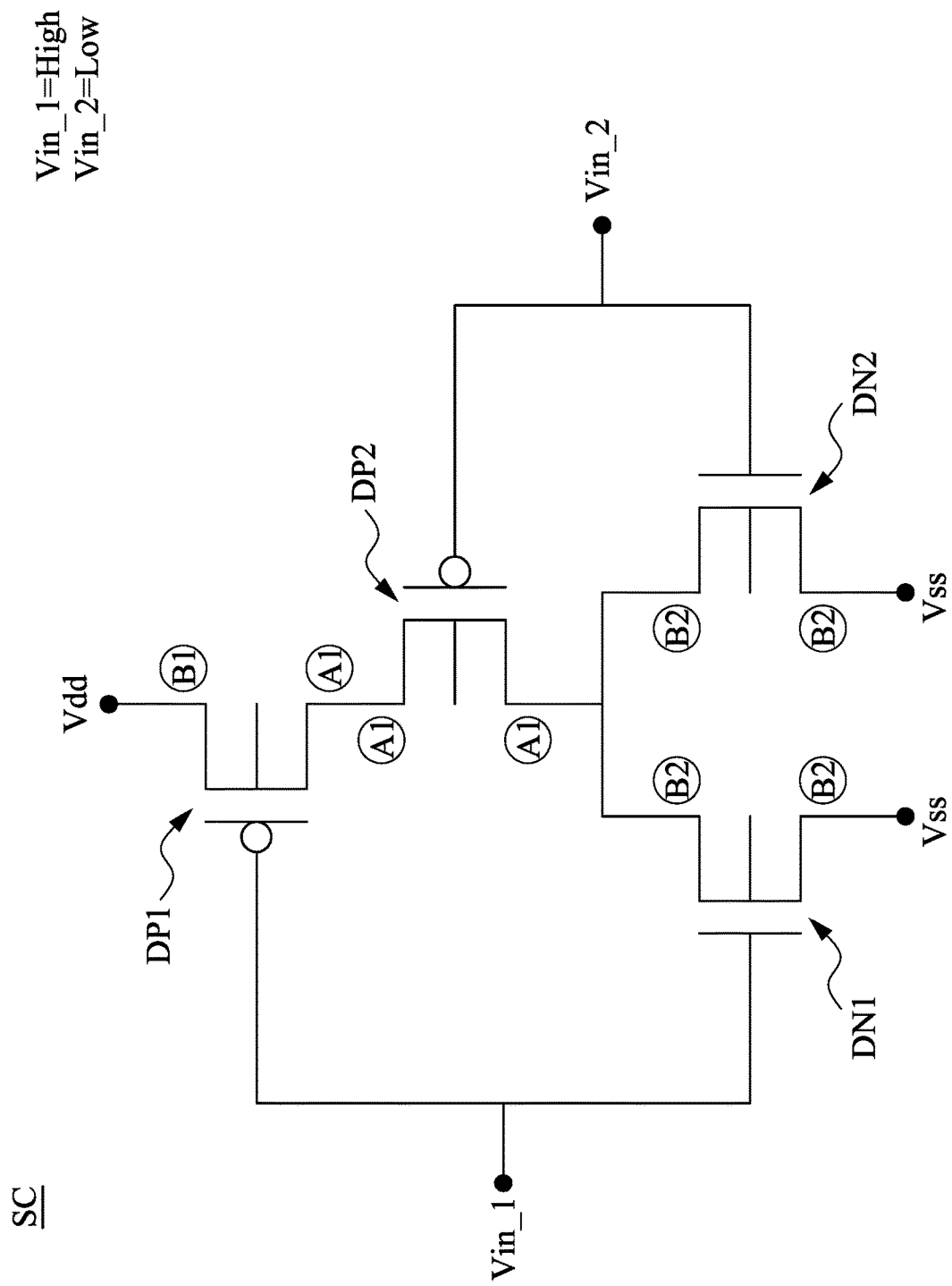

In some embodiments, referring to FIG. 10D, the input voltage Vin_1 of the NOR gate may be at low voltage level (e.g., connected to the low power rail Vss), and the input voltage Vin_2 of the NOR gate may be at high voltage level (e.g., connected to the high power rail Vdd). By counting the numbers of tags A1, A2, B1, and B2 and calculating according to the weighting factor rule, the NOR gate with high/low input voltages has a score of 17. In some embodiments, referring to FIG. 10E, the input voltage Vin_1 of the NOR gate may be at high voltage level (e.g., connected to the high power rail Vdd), and the input voltage Vin_2 of the NOR gate may be at low voltage level (e.g., connected to the low power rail Vss). By counting the numbers of tags A1, A2, B1, and B2 and calculating according to the weighting factor rule, the NOR gate with low/high input voltages has a score of 25.

In some embodiments, the weighting factors C1 and C2 of the NOR gate are greater than the weighting factors D1 and D2 of the NOR gate. In some embodiments, the weighting factors C1, C2, D1, D2 of the NOR gate may be similar to the weighting factors C1, C2, D1, D2 of the inverter as shown in the embodiments of FIGS. 3A-7 or the weighting factors C1, C2, D1, D2 of the NAND gate as shown in the embodiments of FIGS. 9A-9E. For example, the weighting factors C1 and C2 may be greater than about 1 and smaller than about 20, and the weighting factors D1 and D2 may be in a range from about 0 to about 1. In some embodiments, the weighting factors C1, C2, D1, D2 of the NOR gate may be different from the weighting factors C1, C2, D1, D2 of the inverter as shown in the embodiments of FIGS. 3A-7. In some embodiments, the weighting factors C1, C2, D1, D2 of the NOR gate may be different from the weighting factors C1, C2, D1, D2 of the NAND gate as shown in the embodiments of FIGS. 9A-9E.

In some embodiments, since the input voltage of the standard cell may vary over time, the scores of the standard cell may be calculated based on duty ratio. For example, herein, if the NOR gate operates with input voltages Vin_1/Vin_2 at low/low for a time range T1, at high/high for a time range T2, at low/high for a time range T3, and at high/low for a time range T4, a score of the NOR gate may be deemed as a sum of the score of NOR gate with low/low input voltages multiplied by T1/(T1+T2+T3+T4), the score of NOR gate with high/high input voltages multiplied by T2/(T1+T2+T3+T4), the score of NOR gate with low/high input voltages multiplied by T3/(T1+T2+T3+T4), and the score of NOR gate with high/low input voltages multiplied by T4/(T1+T2+T3+T4). For example, if the time ranges T1 to T4 are respectively 40, 60, 80, 20 milliseconds, the score of the NOR gate is about 20.4. For example, if the time ranges T1 to T4 are respectively 50, 50, 50, 50 milliseconds, the score of the NOR gate is about 22.25.

Figure 11:
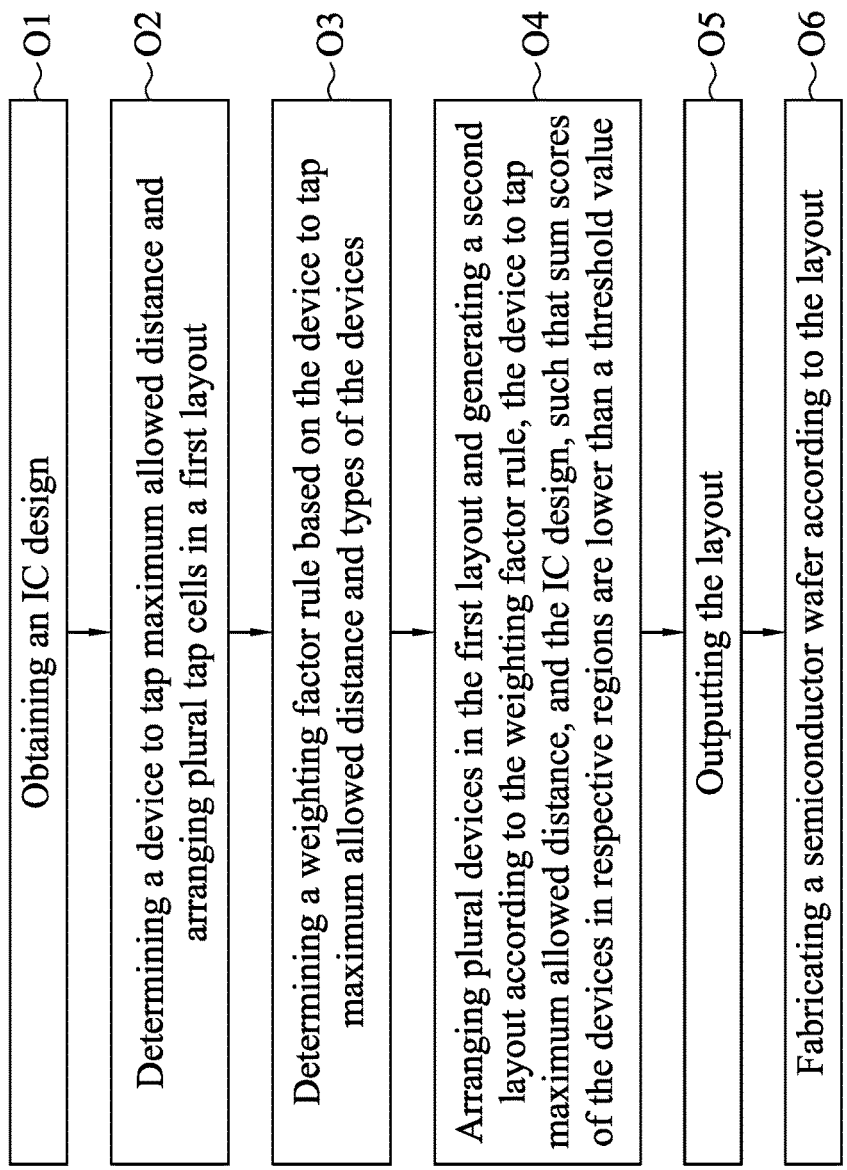
FIG. 11 is a flowchart of a method of generating a layout of an integrated circuit according to some embodiments of the present disclosure.

FIG. 11 is a flowchart of a method N of generating a layout of an integrated circuit according to some embodiments of the present disclosure. The method N may include plural operations O1-O7. The illustration is merely exemplary and is not intended to be limiting beyond what is specifically recited in the claims that follow. It is understood that additional operations may be provided before, during, and after the operations O1-O7, and some of the operations O1-O7 described below can be replaced or eliminated for additional embodiments of the method. The order of the operations may be interchangeable.

In operation O1 of method N, referring to FIGS. 11, 3A and 3B, an IC design 104 may be obtained, for example, from the design house 102, the layout pattern design system 110, or the IC manufacturer 120 (referring to FIG. 1A). The IC design 104 includes plural standard cells SC formed of n-type devices DN and p-type devices DP. For example, the standard cells SC may be inverters INV1-INV8.

Figure 12A:
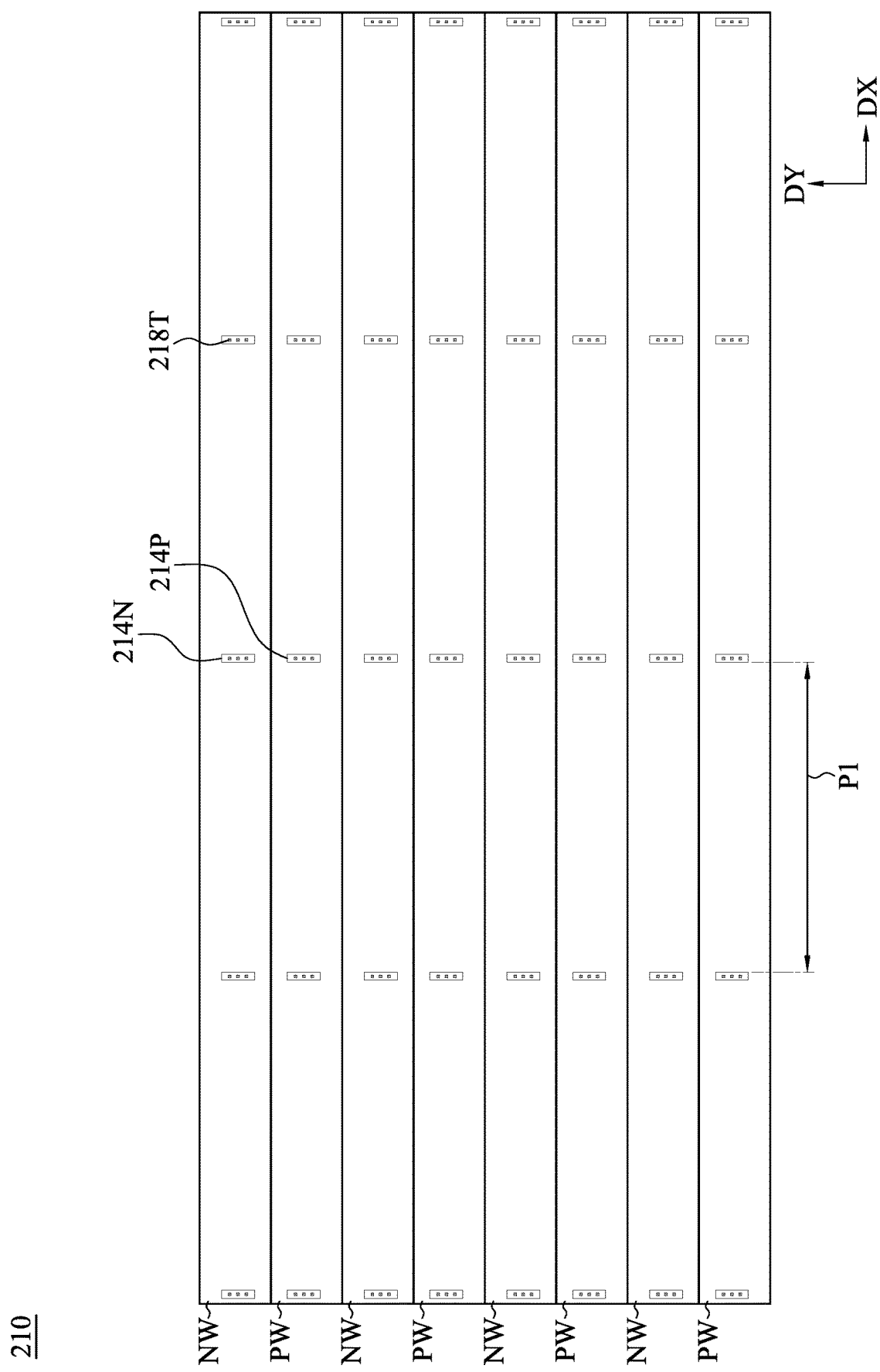
FIG. 12A illustrates arranging plural tap regions in a first layout of an integrated circuit according to some embodiments of the present disclosure.

In operation O2 of method N, a device to tap maximum allowed distance between one of the devices and the nearest tap regions is determined, and plural tap cells 214N/214P are arranged according to the maximum allowed distance. FIG. 12A illustrates arranging plural tap regions in a first layout of an integrated circuit according to some embodiments of the present disclosure. For example, plural tap regions 214N/214P, n-type well regions NW, and p-type well regions PW are arranged in a first layout 210. Other details of the operation O2 are similar to those illustrated at operation S2 of FIG. 1A and in FIG. 4A, and therefore not repeated herein.

In operation O3 of method N, a weighting factor rule regarding the weighting factors assigned to the numbers of the tags A1, A2, B1, B2, and U is determined based on the device to tap maximum allowed distance and types of the devices. Other details of the operation O3 are similar to those illustrated at operation S5 of FIG. 1A, and therefore not repeated herein.

Figure 12B:
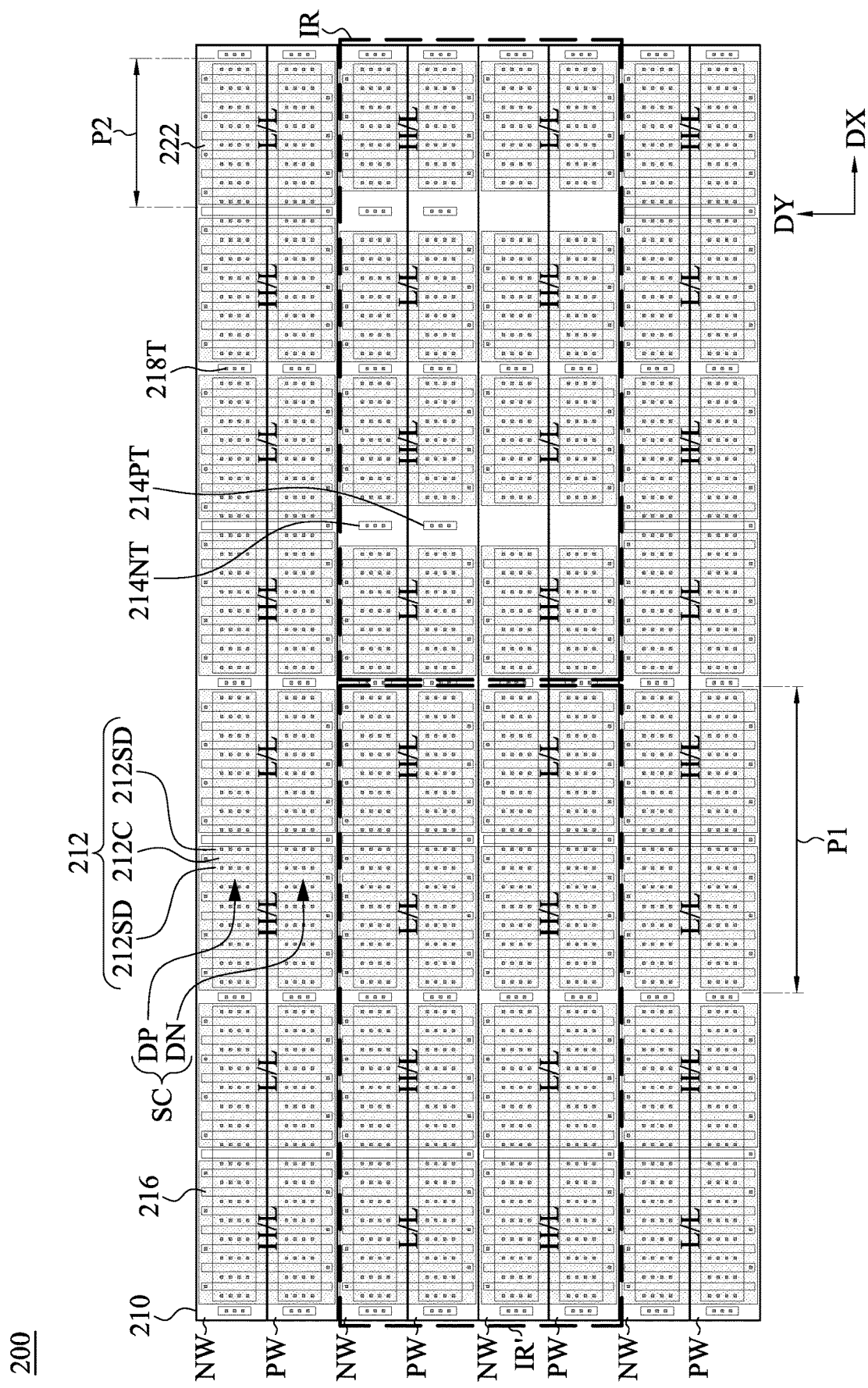
FIG. 12B is a layout of the integrated circuit according to some embodiments of the present disclosure.

Reference is made to FIGS. 11 and 12B. FIG. 12B illustrates arranging plural devices in the first layout of FIG. 12A and generating a second layout on the first layout of FIG. 12A. In operation O4 of method N, the layout pattern design system 110 (referring to FIG. 1A) may arrange the devices DN and DP in the first layout 210 and generate a second layout on the first layout 210 according to the IC design 104 (referring to FIGS. 3A and 3B), the maximum allowed distance, and the weighting factor rule. The second layout includes a metallization pattern arranged according to the first layout 210 and the IC design 104 (referring to FIG. 1A). The second layout may include a BEOL layout. For simplifying the figures, the BEOL layout are briefly illustrated as BEOL blocks 222. The arrangement of the devices DN and DP and metallization pattern (e.g., the BEOL blocks 222) is performed such that scores of the respectively interested regions (e.g., the interested region IR or IR') are lower than a threshold value. The scores of the respectively interested regions (e.g., the interested region IR or IR') may be calculated during arranging the devices DN/DP in the respectively interested regions in the layout 200.

The layout pattern design system 110 may arrange devices DN/DP and the corresponding metallization pattern (e.g., the BEOL blocks 222) first in the interested region IR, and then in the interested region IR'.

In some embodiments, when the layout pattern design system 110 arranging the devices DN/DP and the corresponding metallization pattern (e.g., the BEOL blocks 222) in the interested region IR, if the interested region IR tends to have a score higher than the threshold value, the layout pattern design system 110 (referring to FIG. 1A) may add one or more tap cell (e.g., inter tap regions 214NT/214PT) in to the region IR, thereby lowering the score in the region. Alternatively, in some embodiments, when the layout pattern design system 110 arranging the devices DN/DP and the corresponding metallization pattern (e.g., the BEOL blocks 222) in the interested region IR, if the interested region IR tends to have a score higher than the threshold value, the layout pattern design system 110 (referring to FIG. 1A) may stop arranging the devices DN/DP and the corresponding metallization pattern (e.g., the BEOL blocks 222) in the region IR and move to a next interested region to arrange devices DN/DP and the corresponding metallization pattern (e.g., the BEOL blocks 222) in the next interested region. That is, it is not necessary to use the configuration of the inter tap regions 214NT/214PT for avoiding a score higher than the threshold value. Through the operation O4, the layout pattern design system 110 (referring to FIG. 1A) may generate the layout 200 without removing depicted elements (e.g., devices) in the first layout 210. That is, no amendment is made to the layout 200 for lowering the scores.

In some embodiments of the present disclosure, scores of interested regions (e.g., the interested region IR) are calculated when arranging the devices DN/DP and the metallization pattern (e.g., the BEOL blocks 222) in the corresponding interested regions (e.g., the interested region IR). For example, in some embodiments, the devices DN/DP and the metallization pattern (e.g., the BEOL blocks 222) are arranged in the interested region IR, and the score of the interested region IR is calculated simultaneously. After the devices DN/DP and the metallization pattern are arranged in the interested region IR, the devices DN/DP and the metallization pattern (e.g., the BEOL blocks 222) are arranged in the interested region IR', and the score of the interested region IR' is calculated simultaneously.

In some embodiments, a floorplanning method (e.g., static state driven floorplanning method) is performed for generating the first layout 210 as shown in FIGS. 12A and 12B, and then a physical design method (e.g., Automatic Placement & Routing (APR) method) is perform for generating the second layout.

Then, the method N proceeds to the operation O5, where the layout 200 include the first layout 210 and the BEOL layout (e.g., the blocks 222) is outputted. Then, the method N proceeds to the operation O6, where a semiconductor wafer is fabricated according to the layout 200 including the first layout 210 and the second layout (e.g., the blocks 222), thereby obtaining semiconductor devices.

In some embodiments, the operations O2-O5 described with respect to FIG. 11 are realized as functions of a program stored in a non-transitory computer readable recording medium, for example, in the memory 1102 in FIG. 1B. In some embodiments, the operations O2-O5 described with respect to FIG. 11 are implemented by specially configured hardware component 1106 in FIG. 1B separated from or in lieu of the processor 1101 in FIG. 1B. Other details of the present embodiments are similar to those discussed previously with respect to FIGS. 2-8, and therefore not repeated herein for the sake of brevity.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a layout of the ICs is generated by placing the tap cells, the transistors, and/or interconnect metallization pattern in an arrangement that is less likely to induce latch-up. Another advantage is that by placing the tap cells more in high risk regions and less in non-risk regions, chip area may be saved.

According to some embodiments of the present disclosure, a method for forming an integrated circuit (IC) is provided. The method includes obtaining an IC design; generating a layout according to the IC design; calculating a score of a region in the layout based on a plurality of voltage levels in the region; and fabricating a semiconductor device according to the layout when the score of the region in the layout is equal to or less than a threshold value.

According to some embodiments of the present disclosure, a method for forming an IC is provided. The method includes obtaining an IC design; arranging a plurality of tap regions in a layout; arranging a plurality of devices and a metallization pattern in a first region and a second region in the layout after arranging the tap regions in the layout, such that a score of the first region in the layout is equal to or less than a threshold value, and a score of the second region in the layout is equal to or less than the threshold value; fabricating a semiconductor device according to the layout.

According to some embodiments of the present disclosure, an integrated circuit includes a semiconductor substrate, plural devices, plural first tap regions, and plural second tap regions. The devices are over the semiconductor substrate. The first tap regions are over the semiconductor substrate along a first direction. The second tap regions are over the semiconductor substrate along the first direction. A pitch between adjacent two of the first tap regions in the first direction is greater than a pitch between adjacent two of the second tap regions in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), comprising:
    obtaining an IC design;
    generating a layout according to the IC design;
    calculating a score of a region in the layout based on a plurality of voltage levels in the region; and
    fabricating a semiconductor device according to the layout when the score of the region in the layout is equal to or less than a threshold value.

2. The method of claim 1, further comprising:
    adjusting the region in the layout when the score of the region is greater than the threshold value.

3. The method of claim 2, wherein adjusting the region in the layout is performed such that the score of the region is lowered.

4. The method of claim 2, wherein adjusting the region in the layout comprises:
    adding an inter tap region into the region in the layout.

5. The method of claim 4, wherein adjusting the region in the layout further comprises:
    removing a device in the region in the layout prior to adding the inter tap region into the region in the layout.

6. The method of claim 4, wherein adding the inter tap region into the region in the layout is performed such that the inter tap region is between and immediately adjacent to a first device and a second device in the region in the layout.

7. The method of claim 2, wherein generating the layout comprises:
    arranging a plurality of tap regions in a first layout;
    arranging a plurality of devices in the first layout after arranging the tap regions in the first layout; and
    arranging a metallization pattern in a second layout on the first layout after arranging the devices in the first layout, wherein adjusting the region in the layout comprises:
    adjusting the metallization pattern in the second layout.

8. The method of claim 7, wherein adjusting the metallization pattern in the second layout is performed such that the devices and the tap regions in the first layout remain unchanged.

9. The method of claim 1, wherein generating the layout is performed such that the layout comprises a plurality of devices in the region, each of the devices has a plurality of nodes, and calculating the score of the region comprises:
    tagging the nodes of the devices based on the voltage levels at the nodes and a plurality of conductive types of the devices according to the IC design;
    counting a first number of the nodes of a first tag type according to a tagged result;
    counting a second number of the nodes of a second tag type according to the tagged result; and
    obtaining the score of the region based on the first number and the second number.

10. The method of claim 9, wherein obtaining the score of the region comprises:
    adding up the first number multiplied by a first weighting factor and the second number multiplied by a second weighting factor.

11. The method of claim 9, further comprising:
    counting a third number of the nodes of a third tag type according to the tagged result; and
    counting a fourth number of the nodes of a fourth tag type according to the tagged result.

12. The method of claim 11, wherein obtaining the score of the region comprises:
    adding up the first number multiplied by a first weighting factor, the second number multiplied by a second weighting factor, the third number multiplied by a third weighting factor, and the fourth number multiplied by a fourth weighting factor.

13. A method for forming an integrated circuit (IC), comprising:
    generating a first layout, wherein the first layout comprises a first tap region, a second tap region, and a plurality of first devices between the first and second tap regions, wherein each of the first devices has a plurality of first nodes;

generating a second layout on the first layout, wherein the second layout comprises a metallization pattern;

calculating a first score based on a plurality of first voltage levels at the first nodes of the first devices based on the first and second layouts;

adding an inter tap region between the first and second tap regions when the first score is greater than a threshold value; and fabricating a semiconductor device according to the first and second layouts after adding the inter tap region.

14. The method of claim 13, further comprising:
removing one of the devices between the first and second tap regions prior to adding the inter tap region.

15. The method of claim 13, wherein adding the inter tap region is performed such that a first portion of the devices is between the first tap region and the inter tap region, and a second portion of the devices is between the second tap region and the inter tap region.

16. The method of claim 13, wherein the first layout comprises a third tap region, a fourth tap region, and a plurality of second devices between the third and fourth tap regions, and each of the second devices has a plurality of second nodes, wherein the method further comprises:
calculating a second score based on a plurality of second voltage levels at the second nodes of the second devices based on the first and second layouts, wherein the second score is equal to or less than the threshold value, and adding the inter tap region between the first and second tap regions is performed such that no inter tap region is between the third and fourth tap regions.

17. The method of claim 13, wherein generating the first layout is performed such that the first tap region and the second tap region are of a same first conductive type, and the first devices are of a second conductive type opposite to the first conductive type.

18. A method for forming an integrated circuit (IC), comprising:
generating a first layout, wherein the first layout comprises a plurality of first conductive-type devices and a plurality of second conductive-type devices, wherein each of the first conductive-type devices has a plurality of first nodes, and each of the second conductive-type devices has a plurality of second nodes;

generating a second layout on the first layout, wherein the second layout comprises a metallization pattern;

calculating a score based on a plurality of voltage levels at the first nodes of the first conductive-type devices and the second nodes of the second conductive-type devices based on the first and second layouts;

adjusting the second layout to change the voltage levels at the first nodes of the first conductive-type devices and the second nodes of the second conductive-type devices, such that the score is lowered; and fabricating a semiconductor device according to the first and second layouts after adjusting the second layout.

19. The method of claim 18, wherein adjusting the second layout is performed such that the first conductive-type devices and the second conductive-type devices of the first layout remain unchanged.

20. The method of claim 18, wherein calculating the score comprises:
determining a first number of the first nodes of the first conductive-type devices at a first voltage level;
determining a second number of the first nodes of the first conductive-type devices at a second voltage level higher than the first voltage level;
determining a third number of the second nodes of the second conductive-type devices at a third voltage level; and
determining a fourth number of the second nodes of the second conductive-type devices at a fourth voltage level higher than the third voltage level; and
obtaining the score based on the first to fourth numbers.

* * * * *

UNITED STATES PATENT AND TRADEMARK OFFICE
CERTIFICATE OF CORRECTION

| | | |
|---|---|---|
| PATENT NO. | : 11,416,666 B1 | Page 1 of 1 |
| APPLICATION NO. | : 17/192617 | |
| DATED | : August 16, 2022 | |
| INVENTOR(S) | : Ming-Fang Lai et al. | |

It is certified that error appears in the above-identified patent and that said Letters Patent is hereby corrected as shown below:

On the Title Page

(73) Assignee:
Please change: "TAIWAN SEMICONDUCTOR MANUFACTURING CO., LTD."
To: --TAIWAN SEMICONDUCTOR MANUFACTURING COMPANY, LTD.--

Signed and Sealed this
Fourteenth Day of February, 2023

Katherine Kelly Vidal
*Director of the United States Patent and Trademark Office*